United States Patent
Choi et al.

(10) Patent No.: US 8,282,735 B2
(45) Date of Patent: Oct. 9, 2012

(54) ATOMIC LAYER DEPOSITION APPARATUS

(75) Inventors: Seung Woo Choi, Cheonan-si (KR);
Gwang Lae Park, Hwaseong-si (KR);
Chun Soo Lee, Daejeon-si (KR); **Jeong
Ho Lee, Seoul (KR); Young Seok Choi**,
Daejeon-si (KR)

(73) Assignee: ASM Genitech Korea Ltd.,
Chungcheongnam-Do (KR)

( * ) Notice: Subject to any disclaimer, the term of this patent is extended or adjusted under 35 U.S.C. 154(b) by 769 days.

(21) Appl. No.: 12/324,178

(22) Filed: Nov. 26, 2008

(65) Prior Publication Data
US 2009/0136665 A1    May 28, 2009

(30) Foreign Application Priority Data

Nov. 27, 2007 (KR) .................. 10-2007-0121480

(51) Int. Cl.
*C23C 16/455*    (2006.01)
*C23F 1/00*    (2006.01)
*H01L 21/306*    (2006.01)
*C23C 16/06*    (2006.01)
*C23C 16/22*    (2006.01)

(52) U.S. Cl. ............. 118/715; 156/345.33; 156/345.34

(58) Field of Classification Search .................. 118/715; 156/345.33, 345.34
See application file for complete search history.

(56) References Cited

U.S. PATENT DOCUMENTS

| | | |
|---|---|---|
| 3,397,297 A | 8/1968 | McCorry |
| 3,696,779 A | 10/1972 | Murai et al. |
| 4,058,430 A | 11/1977 | Suntola et al. |
| 4,421,786 A | 12/1983 | Mahajan et al. |
| 4,482,419 A | 11/1984 | Tsukada et al. |

(Continued)

FOREIGN PATENT DOCUMENTS

EP    0687749    12/1995

(Continued)

OTHER PUBLICATIONS

Suntola, T. "The Handbook of Crystal Growth 3," *Thin Films and Epitaxy, Part B*: Growth Mechanisms and Dynamics, Chapter 14, Atomic Layer epitaxy, pp. 601-663, Elsevier Science B.V.

*Primary Examiner* — Rudy Zervigon
(74) *Attorney, Agent, or Firm* — Knobbe, Martens Olson & Bear LLP

(57) ABSTRACT

A reactor configured to subject a substrate to alternately repeated surface reactions of vapor-phase reactants is disclosed. In one embodiment, the reactor includes a reaction chamber that defines a reaction space; one or more inlets; an exhaust outlet; a gas flow control guide structure; and a substrate holder. The gas flow control guide includes one or more channels, each of which extends from a respective one of the one or more inlets to a first portion of a periphery of the reaction space. Each of the channels widens as the channel extends from the inlet to the reaction space. At least one of the channels is configured to generate a non-uniform laminar flow at the first portion of the periphery of the reaction space such that the laminar flow includes a plurality of flow paths that provide different amounts of a fluid. The reaction chamber may include a reactor base and a reactor cover detachable from each other; and a driver configured to independently adjust at least three portions of the reactor base to provide a substantially perfect seal to the reactor space.

28 Claims, 12 Drawing Sheets

U.S. PATENT DOCUMENTS

| | | | |
|---|---|---|---|
| 4,991,540 A * | 2/1991 | Jurgensen et al. | 118/715 |
| 5,281,274 A | 1/1994 | Yoder | |
| 5,338,362 A | 8/1994 | Imahashi | |
| 5,366,555 A | 11/1994 | Kelly | |
| 5,370,738 A * | 12/1994 | Watanabe et al. | 118/725 |
| 5,532,190 A * | 7/1996 | Goodyear et al. | 438/710 |
| 5,595,606 A | 1/1997 | Fujikawa et al. | |
| 5,667,592 A | 9/1997 | Botnott et al. | |
| 5,711,811 A | 1/1998 | Suntola et al. | |
| 5,730,801 A | 3/1998 | Tepman et al. | |
| 5,730,802 A | 3/1998 | Ishizumi et al. | |
| 5,916,365 A | 6/1999 | Sherman | |
| 6,002,108 A | 12/1999 | Yoshioka | |
| 6,015,590 A | 1/2000 | Suntola et al. | |
| 6,113,984 A | 9/2000 | MacLeish et al. | |
| 6,162,299 A | 12/2000 | Raaijmakers | |
| 6,190,457 B1 | 2/2001 | Arai et al. | |
| 6,245,192 B1 * | 6/2001 | Dhindsa et al. | 156/345.34 |
| 6,302,965 B1 * | 10/2001 | Umotoy et al. | 118/715 |
| 6,342,277 B1 | 1/2002 | Sherman | |
| 6,394,440 B1 | 5/2002 | Carrell et al. | |
| 6,399,510 B1 | 6/2002 | Riley et al. | |
| 6,432,831 B2 * | 8/2002 | Dhindsa et al. | 438/710 |
| 6,444,042 B1 * | 9/2002 | Yang et al. | 118/724 |
| 6,511,539 B1 | 1/2003 | Raaijmakers | |
| 6,539,891 B1 | 4/2003 | Lee et al. | |
| 6,551,044 B1 | 4/2003 | Stevens | |
| 6,562,140 B1 | 5/2003 | Bondestam et al. | |
| 6,572,705 B1 | 6/2003 | Suntola et al. | |
| 6,613,695 B2 | 9/2003 | Pomarede et al. | |
| 6,645,574 B1 | 11/2003 | Lee et al. | |
| 6,652,924 B2 | 11/2003 | Sherman | |
| 6,764,546 B2 | 7/2004 | Raaijmakers | |
| 6,797,617 B2 | 9/2004 | Pomarede et al. | |
| 6,806,211 B2 | 10/2004 | Shinriki et al. | |
| 6,812,157 B1 | 11/2004 | Gadgil | |
| 6,820,570 B2 * | 11/2004 | Kilpela et al. | 118/723 R |
| 6,869,641 B2 | 3/2005 | Schmitt | |
| 6,902,620 B1 | 6/2005 | Omstead et al. | |
| 6,902,763 B1 | 6/2005 | Elers et al. | |
| 6,932,871 B2 | 8/2005 | Chang et al. | |
| 6,958,253 B2 | 10/2005 | Todd et al. | |
| 6,974,781 B2 | 12/2005 | Timmermans et al. | |
| 7,020,981 B2 | 4/2006 | Shero et al. | |
| 7,022,184 B2 | 4/2006 | Van Wijck | |
| 7,092,287 B2 | 8/2006 | Beulens | |
| 7,138,336 B2 | 11/2006 | Lee et al. | |
| 7,141,499 B2 | 11/2006 | Raaijmakers | |
| 7,186,582 B2 | 3/2007 | Todd et al. | |
| 7,204,886 B2 * | 4/2007 | Chen et al. | 118/715 |
| 7,294,582 B2 | 11/2007 | Haverkort et al. | |
| 7,402,210 B2 * | 7/2008 | Chen et al. | 118/715 |
| 7,404,984 B2 | 7/2008 | Suntola et al. | |
| 7,498,059 B2 | 3/2009 | Suntola et al. | |
| 7,591,907 B2 * | 9/2009 | Chen et al. | 118/715 |
| 7,608,549 B2 * | 10/2009 | Van Nooten et al. | 438/758 |
| 7,629,267 B2 | 12/2009 | Wan et al. | |
| 7,699,023 B2 * | 4/2010 | Chen et al. | 118/723 VE |
| 7,780,785 B2 * | 8/2010 | Chen et al. | 118/715 |
| 7,794,546 B2 * | 9/2010 | Li | 118/733 |
| 8,100,081 B1 * | 1/2012 | Henri et al. | 118/723 R |
| 2001/0007244 A1 | 7/2001 | Matsuse | |
| 2001/0027026 A1 * | 10/2001 | Dhindsa et al. | 438/712 |
| 2002/0043216 A1 | 4/2002 | Hwang et al. | |
| 2002/0122885 A1 | 9/2002 | Ahn | |
| 2003/0075273 A1 | 4/2003 | Kipela et al. | |
| 2003/0194493 A1 | 10/2003 | Chang et al. | |
| 2004/0009307 A1 | 1/2004 | Koh et al. | |
| 2004/0026037 A1 | 2/2004 | Shinriki et al. | |
| 2004/0052972 A1 | 3/2004 | Schmitt | |
| 2004/0144311 A1 * | 7/2004 | Chen et al. | 118/715 |
| 2004/0187784 A1 | 9/2004 | Sferlazzo | |
| 2004/0221808 A1 | 11/2004 | Kawano | |
| 2005/0034664 A1 | 2/2005 | Koh et al. | |
| 2005/0037154 A1 | 2/2005 | Koh et al. | |
| 2005/0064298 A1 | 3/2005 | Silverman | |
| 2005/0092249 A1 | 5/2005 | Kilpela et al. | |
| 2005/0124154 A1 | 6/2005 | Park et al. | |
| 2005/0208217 A1 | 9/2005 | Shinriki et al. | |
| 2005/0229848 A1 | 10/2005 | Shinriki et al. | |
| 2005/0271814 A1 | 12/2005 | Chang et al. | |
| 2006/0137608 A1 * | 6/2006 | Choi et al. | 118/715 |
| 2006/0249077 A1 * | 11/2006 | Kim et al. | 118/723 MP |
| 2006/0276037 A1 | 12/2006 | Lee et al. | |
| 2007/0026540 A1 * | 2/2007 | Nooten et al. | 438/5 |
| 2007/0089669 A1 | 4/2007 | Raaijmakers | |
| 2007/0209590 A1 * | 9/2007 | Li | 118/719 |
| 2007/0215036 A1 | 9/2007 | Park et al. | |
| 2007/0218702 A1 | 9/2007 | Shimizu et al. | |
| 2008/0075858 A1 | 3/2008 | Koh | |
| 2008/0110399 A1 * | 5/2008 | Park et al. | 118/715 |
| 2008/0241384 A1 * | 10/2008 | Jeong et al. | 427/255.29 |
| 2009/0061644 A1 * | 3/2009 | Chiang et al. | 438/763 |
| 2009/0156015 A1 * | 6/2009 | Park et al. | 438/758 |

FOREIGN PATENT DOCUMENTS

| | | |
|---|---|---|
| JP | 02-074587 | 3/1990 |
| JP | 3048421 | 3/1991 |
| JP | 4320025 | 11/1992 |
| JP | 5047669 | 2/1993 |
| JP | 6291048 | 10/1994 |
| JP | 07/094419 | 4/1995 |
| JP | 2001-013309 | 1/2001 |
| JP | 2002-110567 | 4/2002 |
| KR | 1999-0023078 | 6/1999 |
| KR | 2000-0044823 | 8/2000 |
| KR | 10-2000-0069146 | 11/2000 |
| KR | 10-0273473 | 11/2000 |
| KR | 2001-0046802 | 8/2001 |
| KR | 10-0415475 | 1/2004 |
| KR | 2005-0038606 | 4/2005 |
| KR | 10-0624030 | 9/2006 |
| WO | WO 96/17969 | 6/1996 |
| WO | WO 98/23788 | 6/1998 |
| WO | WO 00/79576 | 12/2000 |
| WO | WO 03/081659 | 10/2003 |
| WO | WO 03/041141 | 5/5003 |

* cited by examiner

ATOMIC LAYER DEPOSITION APPARATUS

CROSS-REFERENCE TO RELATED APPLICATIONS

This application claims priority to and the benefit of Korean Patent Application No. 10-2007-0121480 filed in the Korean Intellectual Property Office on Nov. 27, 2007, the entire contents of which are incorporated herein by reference.

This application is related to U.S. Pat. No. 6,539,891, issued on Apr. 1, 2003, entitled CHEMICAL DEPOSITION REACTOR AND METHOD OF FORMING A THIN FILM USING THE SAME. This application is also related to U.S. Patent Application Publication No. 2006/0249077 published on Nov. 9, 2006, entitled ATOMIC LAYER DEPOSITION APPARATUS. This application is also related to U.S. Patent Application Publication No. 2008/0110399 published on May 15, 2008, entitled ATOMIC LAYER DEPOSITION APPARATUS. This application is also related to U.S. Patent Application Publication No. 2008/0241384 published on Oct. 2, 2008, entitled LATERAL FLOW DEPOSITION APPARATUS AND METHOD OF DEPOSITING FILM BY USING THE APPARATUS.

BACKGROUND

1. Field of the Invention

The present invention relates to an apparatus for growing thin films on a surface of a substrate. More particularly, the present invention relates to an apparatus for producing thin films on a surface of a substrate by subjecting the substrate to alternately repeated surface reactions of vapor-phase reactants.

2. Description of the Related Art

In manufacturing semiconductor devices, various apparatuses and processes have been developed to provide a high quality thin film on a substrate. Several methods have been used to form a thin film, employing surface reaction of a semiconductor substrate. The methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE). ALE was studied extensively for semiconductor deposition and electroluminescent display applications, and has been more recently referred to as Atomic Layer Deposition (ALD) for the deposition of a variety of materials.

ALD is a method of depositing thin films on a surface of a substrate through a sequential introduction of various precursor species to the substrate. The growth mechanism tends to rely on the adsorption of a first precursor on the active sites of the substrate. Conditions are such that no more than a monolayer forms, thereby self-terminating the process. Exposing the substrate to the first precursor is usually followed by a purging stage or other removal process (e.g., a "pump down") wherein any excess amounts of the first precursor as well as any reaction by-products are removed from the reaction chamber. The second precursor is then introduced into the reaction chamber at which time it reacts with the first precursor and this reaction creates the desired thin film. The reaction terminates once all of the available first precursor species adsorbed on the substrate has been reacted. A second purge or other removal stage is then performed which rids the reaction chamber of any remaining second precursor or possible reaction by-products. This cycle can be repeated to grow the film to a desired thickness. The cycles can also be more complex. For example, the cycles may include three or more reactant pulses separated by purge or other removal steps and in some variants pulses can include more than one reactant simultaneously.

In typical ALD processes, reactants are pulsed into a reaction space while the temperature of the reaction space is maintained within a certain range. The temperature range may be in an ALD window above the condensation temperatures of the reactants and below the thermal decomposition temperatures of the reactants. A thin film is formed by saturative surface reactions. Typically, a thin film having a uniform thickness may be formed on the surface of a substrate, regardless of the surface roughness of the substrate. A thin film formed by an ALD process has relatively less impurities, and has relatively high quality. One of the recognized advantages of ALD over other deposition processes is that it is self-saturating and uniform as long as the temperature is within the ALD window and sufficient reactant is provided to saturate the surface in each pulse. Thus, neither temperature nor gas supply needs to be perfectly uniform in order to get uniform deposition.

Lateral or horizontal flow ALD reactors have been proposed. In a lateral flow ALD reactor, gases flow laterally or horizontally over and parallel to the top surface of a substrate. In such a lateral flow ALD reactor, flows of the gases are relatively fast and simple. Thus, high speed switching of gas supplies can be achieved, thereby reducing time for sequentially supplying process gases, and thus increasing throughput. Such increased speed is important because ALD process is inherently slow by comparison to PVD or CVD due to the need for numerous gas switching operations and growth rates typically under one monolayer per cycle. Examples of lateral flow ALD reactors are disclosed in U.S. Pat. No. 5,711,811; U.S. Pat. No. 6,539,891; U.S. Pat. No. 6,562,140; and U.S. Patent Application Publication No. 2006-0249077. In these examples, the ALD reactors have a reaction chamber with a substantially constant gap between the top surface of a substrate processed therein and a reactor surface facing the top surface of the substrate, such that a gas flow over the substrate is a substantially uniform laminar flow. Such reaction chambers may be referred to as "cross-flow reaction chambers."

The above information disclosed in this Background section is only for enhancement of understanding of the background of the invention and therefore it may contain information that does not form prior art already known in this country to a person of ordinary skill in the art.

SUMMARY

In one embodiment, an atomic layer deposition (ALD) reactor, includes: a reaction chamber comprising a reaction space; one or more inlets; an exhaust outlet; a gas flow control guide structure residing over the reaction space, the gas flow control guide structure being interposed between the one or more inlets and the reaction space; and a substrate holder positioned to expose a supported substrate to the reaction space. The gas flow control guide structure includes one or more gas channels, each of the channels extending from a respective one of the one or more inlets to a first portion of a periphery of the reaction space, at least one of the channels including two sidewalls that define the channel so as to widen as the channel extends from the inlet to the reaction space. The at least one channel defines a plurality of flow paths from near a generally central portion of the gas flow control guide structure to the first portion of the periphery of the reaction space. The plurality of flow paths include a first side flow path near one of the sidewalls, a second side flow path near the other of the sidewalls, and a central flow path at a midpoint between the sidewalls, the central flow path having a path-length shorter than that of the side flow paths In another embodiment, an atomic layer deposition (ALD) reactor includes: a reaction chamber comprising a reaction space; one or more inlets; an exhaust outlet; a gas flow control guide structure residing over the reaction space; and a substrate holder positioned to expose a supported substrate to the reaction space. The gas flow control guide structure is interposed between the one or more inlets and the reaction space. The gas flow control guide structure includes one or more gas channels, each of the channels extending from a respective one of the one or more inlets to a first portion of a periphery of the reaction space, at least one of the channels including two sidewalls that define the channel so as to widen as the channel extends from the inlet to the reaction space. The at least one channel has a first height at the center of the channel and a second height at one of the sidewalls, the first height being greater than the second height.

In yet another embodiment, a method of depositing a reactant on a substrate in a reaction space, the reaction space comprising an upstream periphery and a downstream periphery. The method includes a plurality of atomic layer deposition cycles, at least one of the cycles comprising: supplying a reactant to the reaction space. Supplying the reactant includes in sequence: flowing the reactant outwardly and horizontally at a first vertical level toward the upstream periphery of the reaction space while widening a flow path of the reactant, and flowing the reactant vertically to the upstream periphery and into the reaction space, thereby generating a laminar flow substantially parallel to a surface of the substrate, wherein the laminar flow is non-uniform at the upstream periphery of the reaction space in amount of the reactant between a center portion and edge portions of the laminar flow; reacting the reactant with the surface of the substrate; and removing excess first reactant from the reaction space.

In yet another embodiment, a deposition apparatus includes: a reactor cover; a reactor base in sealing contact with the reactor cover to define a reaction space, the reactor base being detachable from the reactor cover; and a reactor base driver configured to vertically move the reactor base between first and second positions. The reactor space is open at the first position, and is closed at the second position. The reactor base driver is configured to independently adjust at least three portions of the reactor base to provide a substantially perfect seal to the reactor space at the second position. The at least three portions are horizontally spaced apart from one another and are not aligned with one another.

DETAILED DESCRIPTION OF THE EMBODIMENTS

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention. While illustrated in the context of a particular type of lateral flow ALD reactor, having plates to define different flow paths, the skilled artisan will readily appreciate that the principles and advantages taught herein apply to other types of reactors.

A substrate having a non-planar surface (e.g., a surface having a plurality of protrusions and/or depressions) (hereinafter referred to as a "non-planar substrate") has an actual surface area larger than a substrate having a substantially planar surface (hereinafter referred to as a "planar substrate"). For example, in a dynamic random access memory (DRAM), a dielectric layer for storing charge may be deposited on a non-planar substrate including patterned folding and/or roughened electrodes, such that the dielectric layer conforms to numerous undulations. Such a substrate may have an actual surface area of about fifty times greater than that of a planar substrate. Similarly, other integrated circuits may have dense and/or high aspect ratio features that substantially increase surface area relative to a planar substrate.

In general, substrates or wafers for a semiconductor integrated circuit have a round planar shape. In a lateral flow ALD reaction chamber, a gas is supplied substantially uniformly over a surface of a substrate such that substantially the same amounts of the gas are provided along different flow paths over the surface of the substrate.

When a non-planar substrate is processed in such a lateral flow ALD reaction chamber, different amounts of a reactant gas may be consumed along different flow paths of the gas over the substrate unlike a planar substrate. Accordingly, a gas supply condition designed for deposition on a planar substrate may not be optimal for a non-planar substrate. With the gas supply condition, pulse duration and an amount of gas required for a saturative gas supply cycle may be greater, compared to those required for deposition on a planar substrate.

Figure 1A:
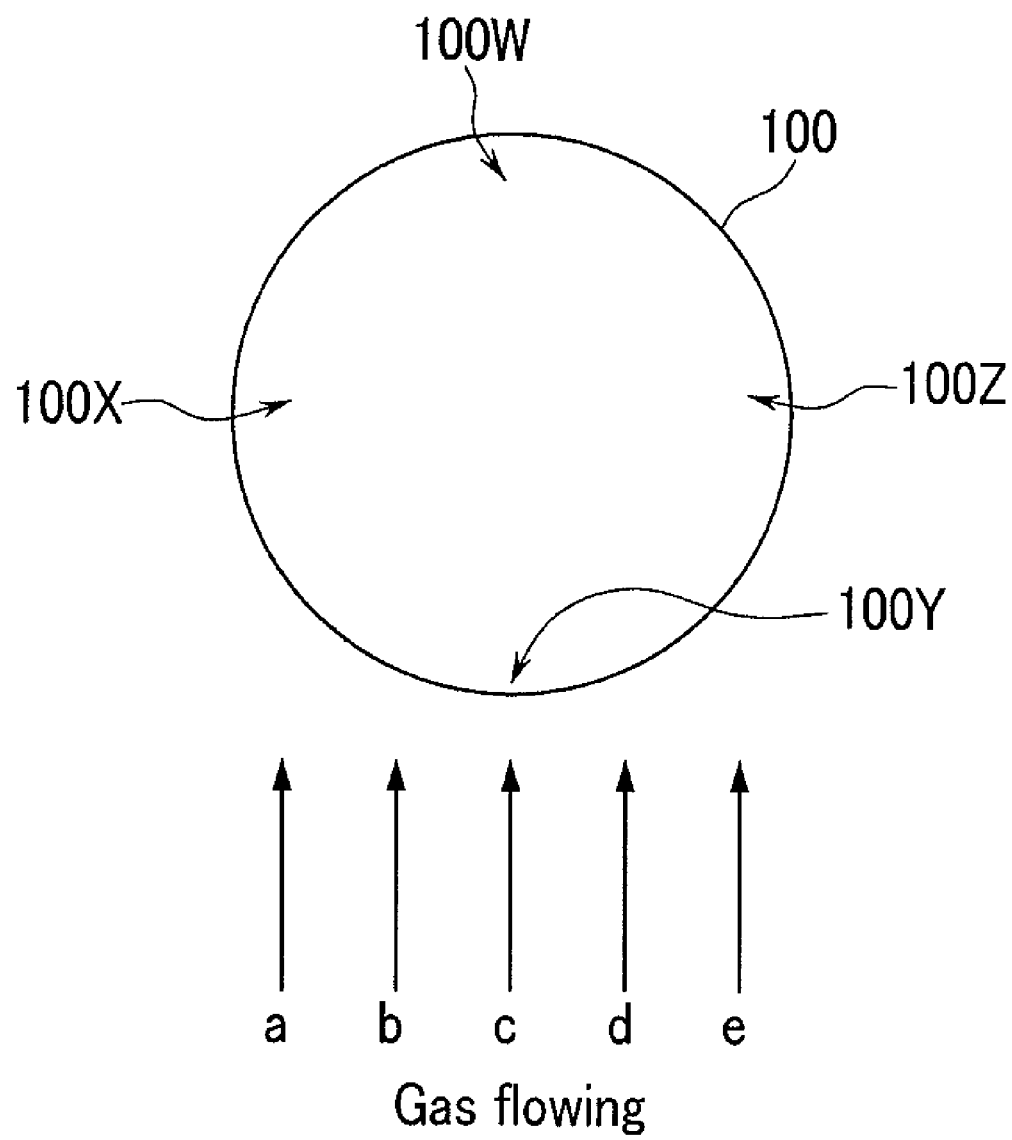
FIG. 1A is a schematic top plan view illustrating gas flow paths over a circular substrate in a lateral flow ALD reaction chamber.

FIG. 1A schematically illustrates gas flows over a circular substrate 100 in a lateral flow ALD reaction chamber. The gas flows are indicated by the arrows. In such a lateral flow ALD reaction chamber, reactants typically flow from an upstream region to a downstream region in the chamber. Because a portion of the reactants is consumed for reaction with the surface of a substrate in the chamber while flowing from the upstream region to the downstream region, reactants are in a higher concentration in the upstream region than in the downstream region.

The illustrated substrate 100 has a non-planar surface that has a substantially greater actual surface area than a planar substrate. When a reactant is supplied to the reaction chamber, forming a uniform horizontal gas flow at a constant flow rate over the substrate 100, the reactant starts to be consumed at positions 100X, 100Y, and 100Z by adsorption or surface reaction on the surface of the substrate 100.

Even after the adsorption or surface reaction at the positions 100X, 100Y, and 100Z has been completed, adsorption or surface reaction at a downstream position 100W may be ongoing, i.e., saturation at the downstream position 100W may take longer. Accordingly, the reactant should continue to be supplied to the reaction chamber until adsorption or surface reaction at the position 100W is completed. Because adsorption or surface reaction at the positions 100X and 100Z has been completed, portions of the reactant that flow over the positions 100X and 100Z are wasted until adsorption or surface reaction at the position 100W is completed. In other words, in order to fully saturate all the portions of the surface of the substrate, a gas must be supplied to all the portions of the substrate until the last-to-saturate portion is saturated.

Figure 1B:
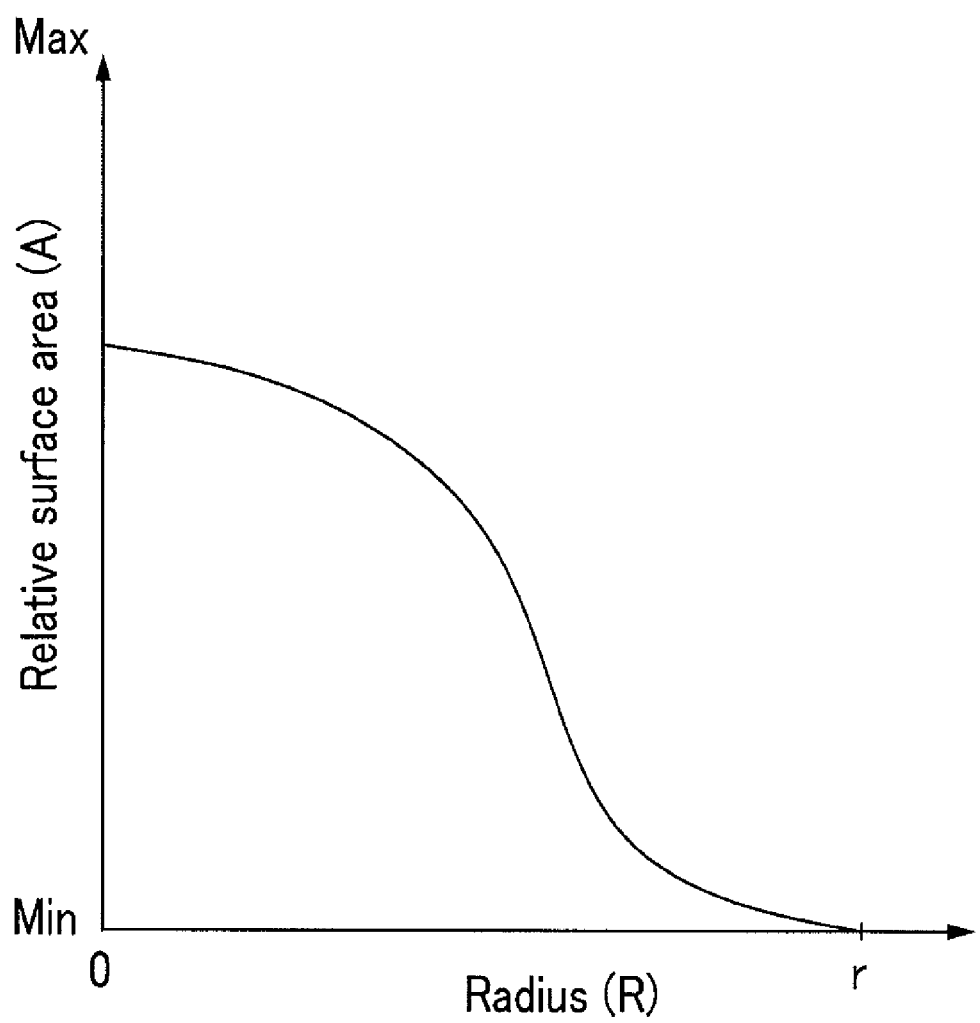
FIG. 1B is a graph showing a relative surface area of a circular substrate over which a gas flows horizontally, depending on the position of gas flow path (shown on the x-axis as R=0 for a central path and R=r for a peripheral path).

FIG. 1B shows a relative surface area A of a circular substrate over which gas flows horizontally depending on the gas flow path. A center gas flow provided over the center of the circular substrate is indicated as "c" in FIG. 1A and "R=0" in the graph of FIG. 1B. The center gas flow covers a larger surface area than edge gas flows provided over the edges of the circular substrate shown as "a" and "e" in FIG. 1A and "R=r" in the graph of FIG. 1B. Accordingly, the amount of the center gas flow should be relatively greater than those of the edge gas flows to reduce or eliminate position-dependent non-uniformity for uniform and efficient deposition of a film on the circular substrate.

In certain instances, however, if reactant gases have a sufficient vapor pressure and/or excess amounts of the reactant gases are supplied to the reaction chamber, the position-dependent non-uniformity may be minimal. For example, oxygen ($O_2$) gas or ozone ($O_3$) gas may be supplied in a greater amount compared to the minimum amount required to form a thin film, such that differences in saturation rate between different portions of the substrate are minimal. However, it may take substantial time to complete saturation with a source gas having a lower vapor pressure, such as tetrakis(ethylmethylamino)hafnium (TEMAHf) or tetrakis(ethylmethylamino)zirconium (TEMAZr), which are often used to form thin films of $HfO_2$ or $ZrO_2$. The same is true of numerous other precursors, including metal halides and metalorganic compounds which are suitable for ALD but have a very low vapor pressure (e.g., less than about 0.1 mmHg) under standard (room temperature and atmospheric pressure) conditions.

For example, if a circular substrate having a diameter of about 300 mm and an actual surface area of about fifty times greater than a planar substrate having the same diameter is processed, the time required for completing adsorption of a source gas on substantially the entire surface of the substrate may be one second or greater. In addition, if a substantial portion of the source gas passes through the reaction chamber without being adsorbed, a longer period of time is required to complete saturative adsorption on substantially the entire surface of the substrate.

Therefore, there is a need for an ALD apparatus that can reduce deposition time and wasted reactants while forming a thin film having a uniform thickness over substantially the entire surface of a substrate.

In addition, it is important to provide the reaction space of a lateral flow ALD reactor with a substantially perfect seal during deposition. To provide such a seal, the reaction space may be closed and sealed by hand through many attempts or by using a precise and expensive driver mechanism. However, a relatively long period of time is required for sealing by hand.

In one embodiment, an atomic layer deposition (ALD) apparatus includes a reaction chamber that defines a reaction space. The ALD apparatus also includes one or more inlets; an exhaust outlet; a gas flow control guide structure; and a substrate holder positioned to expose a supported substrate to the reaction space. The gas flow control guide structure resides over the reaction space, and is interposed between the one or more inlets and the reaction space. The gas flow control guide structure includes one or more channels, each of which extends from a respective one of the one or more inlets to a first portion of a periphery of the reaction space. Each of the channels widens as the channel extends from the inlet to the reaction space. At least one of the channels is configured to generate a non-uniform laminar flow at the first portion of the periphery of the reaction space such that the laminar flow includes a plurality of flow paths that provide different amounts of a fluid.

In some embodiments, the reaction chamber includes a reactor cover and a reactor base in sealing contact with the reactor cover to define the reaction space. The reactor base is detachable from the reactor cover for loading and unloading a substrate. The ALD apparatus also includes a driver configured to vertically move either the reactor cover or the reactor base between first and second positions. The reaction space is open at the first position, and is closed at the second position. The driver is configured to independently adjust at least three portions of the reactor base to provide a substantially perfect seal to the reaction space at the second position. The at least three positions are horizontally spaced apart from one another and are not aligned with one another.

Referring to FIGS. 2-5, an atomic layer deposition (ALD) apparatus according to one embodiment will be described below. It will be understood that FIGS. 2-5 represent only one example of a lateral flow, cross-flow, or horizontal flow ALD reactor.

Figure 2:
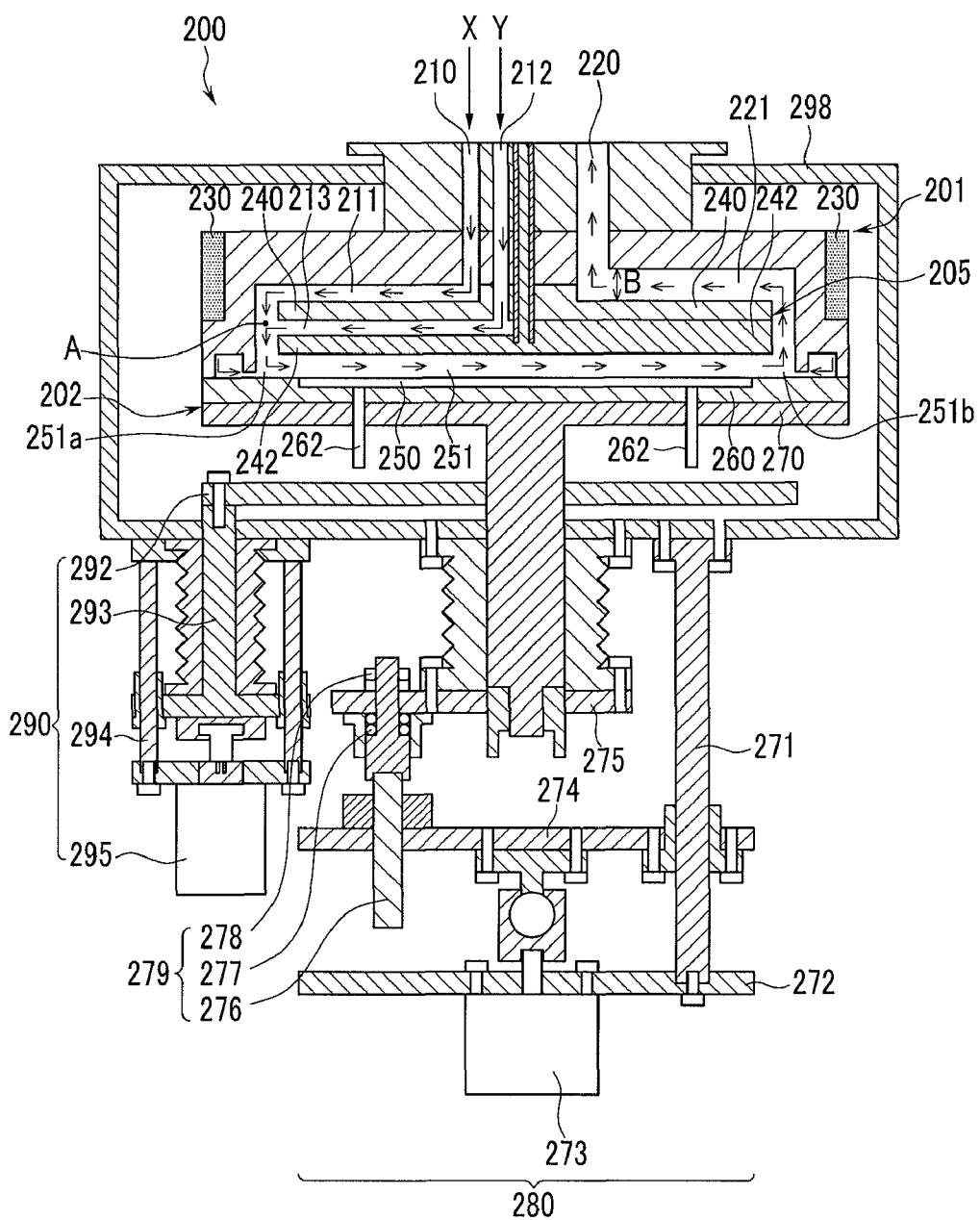
FIG. 2 is a schematic cross-sectional view of an atomic layer deposition apparatus according to one embodiment.

Referring to FIG. 2, an ALD reactor 200 includes a reactor cover 201, a reactor base 202, a reactor base driver 280, a gas flow control guide structure 205, and an outer wall 298. The reactor cover 201 and the reactor base 202 are in sealing contact with each other and define a reaction chamber. The reaction chamber includes a reaction space 251 in which a substrate 250 is processed.

The reaction space 251 is defined between an upper surface of the reactor base 202 and a lower surface of the gas flow control guide structure 205. The reaction space 251 includes an upstream periphery 251a into which a reactant is introduced and a downstream periphery 251b from which excess reactant and reaction by-products are exhausted. The reactor base 202 is detachable from the reactor cover 201 for loading or unloading the substrate 250. The outer wall 298 is configured to pressure-tightly house the reactor cover 201 and the reactor base 202, and can be evacuated through an outer exhaust (not shown) connected to a vacuum pump.

The reactor cover 201 includes first and second inlets 210 and 212, and an exhaust outlet 220. The reactor cover 201 is preferably formed of a metal. In certain embodiments, the reactor cover 201 may be formed of a ceramic material.

The first and second inlets 210 and 212 are in fluid communication with reactant sources (not shown). The first and second inlets 210 and 212 are configured to supply a first reactant X and a second reactant Y, respectively. Preferably, the reactants X and Y are introduced in vapor phase through the inlets 210 and 212. Valves may be located upstream of the inlets 210 and 212 to control the flows of the reactants and the inert gas. For example, 3-way valves can be used to switch gas supply between the inert gas and the reactants for each of the inlets 210 and 212. In addition, the ALD reactor 200 preferably includes a switching mechanism for controlling the valves. In one embodiment, a computer is programmed and used to alternate supplies of the reactants and the inert gas to achieve ALD sequences.

The reactor cover 201 also includes the cover heater 230 on outer surfaces of the reactor cover 201. The cover heater 230 is configured to resistively heat the reactor cover 201 to a predetermined temperature so as to prevent a reactant from condensing on an inner surface of the reactor cover 201.

The reactor base 202 includes a substrate holder 260, one or more substrate supporting pins 262, and a pedestal 270. The substrate holder 260 is configured to support a substrate 250, and preferably has a recess or pocket to secure the substrate 250 and expose only a top surface of the substrate 250. The pedestal 270 is integrally attached to a lower surface of the substrate holder 260, and includes a substrate heater configured to heat the substrate 250 to a predetermined temperature, preferably below the reactants' thermal decomposition temperatures and above the reactants' condensations temperatures, during a deposition process. The substrate holder 260 is formed of a metal, and is preferably electrically grounded. A skilled artisan will appreciate that the structure and material of the reactor base 202 can vary widely, depending on the design of a reactor. The pedestal 270 has a shape including a horizontal portion disposed under the substrate holder 260 and a central vertical portion supporting the center of the substrate holder 260. The horizontal portion and the central vertical portion may form a single body.

The reactor base driver 280 serves to drive the reactor base 202 including the substrate holder 260 and the pedestal 270. The reactor base driver 280 is configured to move the reactor base 202 in a vertical direction, using a driving device (not shown), such as a motor. Before or after a deposition process, the reactor base 202 is moved down and is detached from the reactor cover 201 so that the reaction chamber is open. The substrate 250 can be loaded or unloaded by robotics through a gate valve (not shown) in the outer wall 298. During a deposition process, it is important for the reaction space 251 to be sealed and isolated from the outside.

The reactor base driver 280 includes vertical movement members 271, 272, a first plate 274, a main cylinder 273, a second plate 275, and a leveler 279. The vertical movement members 271, 272 are fixed at the lower portion of the outer wall 298. The first plate 274 is connected to the vertical movement members 271, 272, and is vertically movable. The main cylinder 273 serves to drive the first plate 274 vertically. The second plate 275 is connected to the central vertical portion of the pedestal 270 that supports the substrate holder 260, and is vertically movable.

The leveler 279 is connected to the first and second plates 274 and 275, and maintains the reactor base 202 horizontally while driving the reactor base 202 for opening or closing the reaction chamber. The leveler 279 may include level control members 276 and 277 and an initial level control member 278. The level control members 276 and 277 may include at least one of an air cylinder and a spring. The initial level control member 278 may be a level nut.

Before or after a deposition process, the first and second plates 274 and 275 are moved down by the main cylinder 273 such that the reactor base 202 connected to the second plate 275 is moved down. Accordingly, the reactor base 202 is detached from the reactor cover 201 so that the reaction space 251 is open. While the reaction space 251 is open, the substrate supporting pins 262 may be lifted up (for unloading) or moved down (for loading) such that the substrate 250 is loaded on or unloaded from the substrate holder 260.

During preparation for a deposition process, the substrate supporting pins 262 are moved down such that the substrate 250 is loaded on the substrate holder 260. Then, the first and second plates 274 and 275 are moved up by the main cylinder 273 so that the reactor base 202 connected to the second plate 275 is moved up. Accordingly, the lower peripheral portions of the reactor cover 201 contact the upper peripheral portions of the substrate holder 260 of the reactor base 202, defining the reaction space 251.

The substrate supporting pins 262 are vertically moved by a substrate supporting pin driver 290. The substrate supporting pin driver 290 may include a horizontal plate 292, a central pivot 293, a peripheral pivot 294, and an air cylinder 295.

While FIG. 2 shows only one leveler 279, the apparatus 200 may include a plurality of levelers (for example, at least three levelers) at a plurality of different positions. The levelers may be used to independently adjust different portions of the reactor base 202. This configuration allows the reaction chamber to be substantially perfectly sealed. This will be described later in more detail with reference to FIG. 8A to FIG. 8E.

Referring still to FIG. 2, the gas flow control guide structure 205 includes an upper gas flow control plate 240 and a lower gas flow control plate 242. The lower gas flow control plate 242 serves as a ceiling-defining member or part for the reaction space 251, and hence is spaced apart from the supported substrate 250.

The upper gas flow control plate 240 is stacked over the lower gas flow control plate 242. A central portion of the upper gas flow control plate 240 is attached to an inner bottom surface of the reactor cover 201. In other embodiments, the gas flow control guide structure 205 may further include additional gas control plates, depending on the number of reactants supplied into the reactor. It is preferred to keep mutually reactive ALD reactants separate from one another such that for most ALD recipes one plate is desired for each reactant.

The gas flow control plates 240 and 242 may be detachable from the reactor cover 201. This configuration allows easy maintenance and cleaning. In certain embodiments, however, the gas flow control guide structure may be integrally formed with the reactor cover 201.

The gas flow control guide structure 205 defines a first inflow channel 211, a second inflow channel 213 and an outflow channel 221. Each of the inflow channels 211, 213 maintains a separate flow path to the reaction space 251.

In another embodiment (not shown), a plasma-generating electrode is configured to generate plasma in the reaction space 251 during a deposition process. In this case, the electrode can be formed as a part of the lower surface of the lower plate 242, in which case the electrode defines a ceiling of the reaction space 251. The plasma-generating electrode may also or alternatively generate plasma for cleaning the reaction chamber.

Figure 3A:
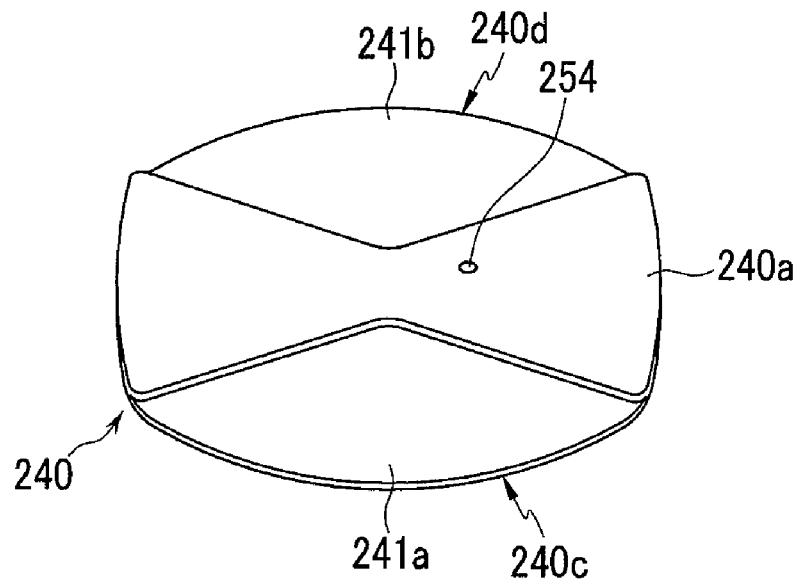
FIG. 3A and FIG. 3B are perspective top views of embodiments of upper and lower gas flow control plates, respectively, of the apparatus of FIG. 2.

Referring to FIG. 3A, an upper gas flow control plate 240 has first and second grooves 241a and 241b that are tapered toward its central portion. In other words, the grooves 241a and 241b have a fan shape that widens toward edge portions of the upper gas flow control plate 240 as they extend from the central portion of the plate 240 to the edge portions of the plate 240.

Figure 5:
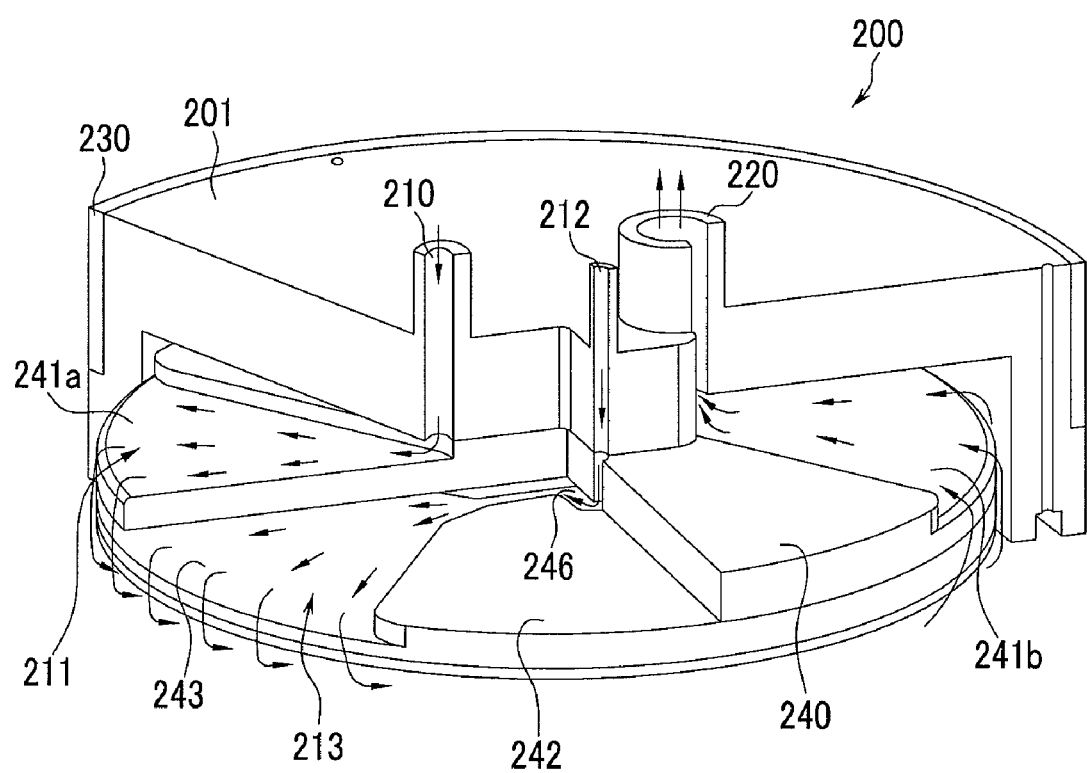
FIG. 5 is a perspective, partially cut-away view of the atomic layer deposition apparatus of FIG. 2.

The first groove 241a defines a first inflow channel or passage 211 in cooperation with a portion of an inner bottom surface of the reactor cover 201 for the reactant X supplied through the first inlet 210, as shown in FIG. 2 and FIG. 5. The second groove 241b defines an outflow channel or passage 221 in cooperation with another portion of the inner bottom surface of the reactor cover 201 for excess reactant and reaction by-products, as shown in FIG. 2. The upper gas flow control plate 240 also has a through-hole 254 vertically penetrating the upper gas flow control plate 240. The through-hole 254 is configured to be in fluid communication with the second inlet 212 shown in FIG. 2 and a groove 246 of the lower gas flow control plate 242, which will be described below with reference to FIG. 3B. Multiple through-holes can be provided for embodiments with more than two plates for more than two reactants. The upper gas flow control plate 240 may be formed of a metallic or ceramic material.

The upper gas flow control plate 240 also includes a solid part 240a between or around the first and second grooves 241a and 241b. The solid part 240a forms sidewalls of the first and second grooves 241a and 241b. With reference to FIG. 2, the solid part 240a is configured to abut the lower surface of the chamber ceiling defined by the reactor cover 201 and force the gas flow outward from the first inlet 210, around a first plate periphery 240c of the upper gas flow control plate 240, through the reaction space 251, around a second plate periphery 240d of the upper gas flow control plate 240, and inward to the exhaust outlet 220.

Figure 4:
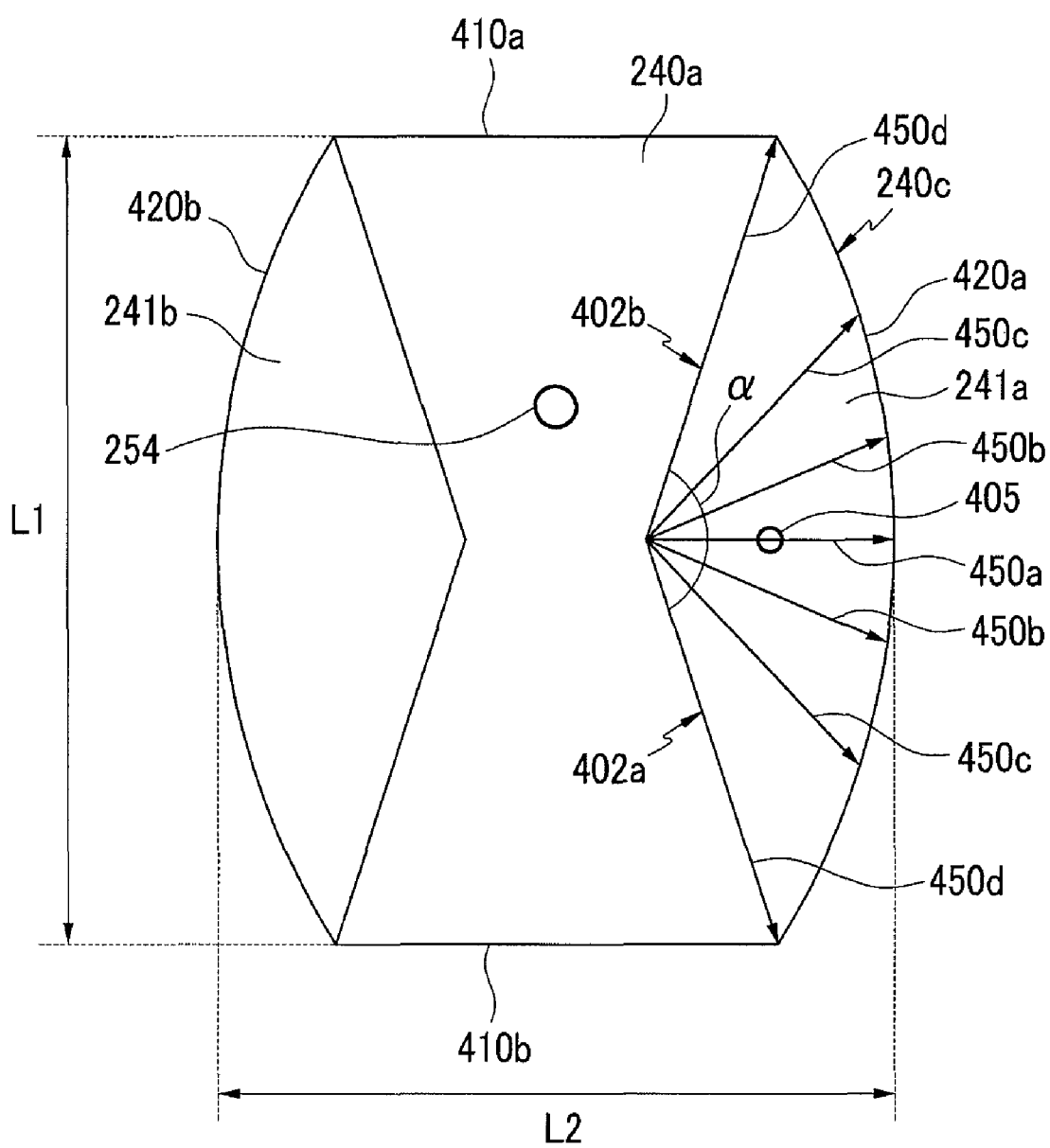
FIG. 4 is a schematic top plan view illustrating one embodiment of the upper gas flow control plate of the apparatus of FIG. 2.

Referring to FIG. 4, the upper gas flow control plate 240 has a non-circular, elongated shape, for example, a truncated oval shape, when viewed from above. The illustrated upper gas flow control plate 240 has straight edges 410a, 410b, and round edges 420a, 420b. The lengths of the round edges 420a, 420b are generally longer than the lengths of the straight edges 410a, 410b. The upper gas flow control plate 240 has a first length L1 generally perpendicular to the straight edges 410a, 410b, and a second length L2 generally parallel to the straight edges 410a, 410b. A ratio of the first length L1 to the second length L2 may be from about 1:1 to about 1.2:1. Thus, the dimension parallel to the gas flow in the reaction space below is shorter than the dimension perpendicular to that gas flow direction. The reactor cover 201 may have an inner space adapted to fit the shape of the upper gas flow control plate 240. In other embodiments, the reactor cover 210 may have a cylindrical inner space having a circular shape when viewed from above, and may further include another insert member to fit the shape of the upper gas flow control plate 240.

As shown in FIG. 4, the first groove 241a has a fan shape defined by a corner 401, sidewalls 402a, 402b, and a first plate periphery 240c. The center of the fan shape is indicated by a reference number 405. The sidewalls 402a, 402b form an angle α at the corner 401. The angle α may be from about 20° to about 180°, and optionally from about 90° to about 160°.

The first groove 241a provides a plurality of gas flow paths 450a-450d having different lengths from the corner 401 (which communicates with the inlet 210 in FIG. 2) to the first plate periphery 240c. A central gas flow path 450a passing over the center 405 of the groove 241a has the shortest length. Side gas flow paths 450d along the sidewalls 402a, 402b of the first groove 241a have the longest length. Gas flow paths 450b, 450c between the central gas flow path 450a and the side gas flow paths 450d have a length between the shortest and longest lengths. The closer a gas flow path is to the sidewalls 402a, 402b of the first groove 241a, the longer the gas flow path is. The shape of the reaction space 251 (FIG. 2) causes laminar flow across the substrate, downstream of the first plate periphery 240c.

In the illustrated embodiment, a gas flows from the first inflow channel 211 toward the upstream periphery 251a (FIG. 2) while being spread into a fanned and flattened flow shape. Accordingly, the gas arriving at the upstream periphery 251a may have different inflow distributions, depending on the lengths of the gas flow paths in the first groove 241a. In other words, some portions of the gas may arrive at the first plate periphery 240c relatively slowly via the side gas flow paths 450d having the longest path length while other portions of the gas may arrive at the first plate periphery 240c relatively quickly via the central gas flow path 450a having the shortest path length. Accordingly, an amount of gas arriving at side portions of the first plate periphery 240c is relatively small, and an amount of gas arriving at the center of the first plate periphery 240c is relatively large.

Accordingly, more reactant gases per unit of time can be supplied over the center portion of the substrate 250 (representing the longest path over the substrate) than over the side portions of the substrate 250 (representing the shortest paths over the substrate). This configuration can reduce or eliminate position-dependent non-uniformity due to a uniform laminar gas flow, thereby allowing uniform and efficient deposition on the circular substrate 250.

Referring again to FIG. 3B, the lower gas flow control plate 242 has a lower groove 243 on its upper surface that is tapered toward its central portion. Although the first groove 241a of the upper gas flow control plate 240 is shown in FIG. 4, the lower groove 243 of the lower gas flow control plate 242 may have substantially the same shape as that of the first groove 241a. The lower groove 243 has a fan shape that widens toward edge portions of the lower gas flow control plate 242. The gas flow paths defined by the lower groove 243 are longer as they are closer to the sidewalls of the groove 243.

Figure 3B:
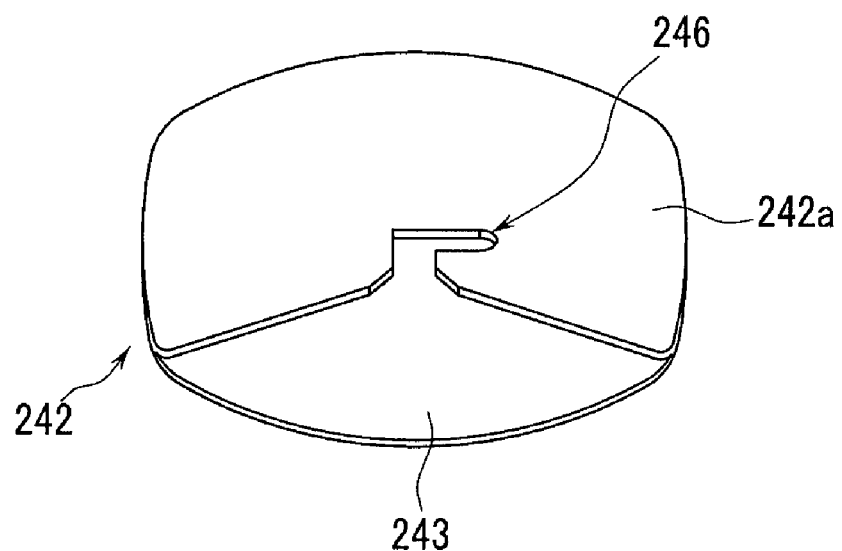

As shown in FIG. 2 and FIG. 5, the lower groove 243 defines the second inflow channel 213 in cooperation with a lower surface of the upper gas flow control plate 240 for the reactant Y supplied through the second inlet 212. As shown in FIG. 3B, the lower groove 243 further extends to a central groove 246 of the lower gas flow control plate 242 so that the second inflow channel 213 is in fluid communication with the second inlet 212 via the through-hole 254 of the upper gas flow control plate 240.

The lower gas flow control plate 242 also includes a solid part 242a around the lower groove 243 and the central groove 246. The solid part 242a forms sidewalls of the grooves 243 and 246, which, as shown in FIG. 2, cooperates with a lower surface of the upper gas flow control plate 240 to force the gas flow outward from the second inlet 212, around a plate periphery of the lower gas flow control plate 242, through the reaction space 251, around another plate periphery of the lower gas flow control plate 242, and inward to the outflow channel 221 defined by the upper gas flow control plate 240, and out the exhaust outlet 220.

In the illustrated embodiment, a gas flows from the second gas inflow channel 213 to the upstream periphery 251a (FIG. 2) while being spread into a fanned and flattened flow shape. Accordingly, the gas arriving at the upstream periphery 251a has different inflowing distributions, depending on the lengths of the gas flow paths in the fanwise lower groove 243. The details of the inflowing distribution can be as described above with respect to the first groove 241a. Accordingly, more reactant gases per unit of time may be supplied over the center portion of the substrate 250 (representing the longest path over the substrate) than the side portions of the substrate 250 (representing the shortest paths over the substrate). This configuration can reduce or eliminate position-dependent non-uniformity due to a uniform laminar gas flow, thereby allowing uniform and efficient deposition on the circular substrate 250.

In an ALD method of depositing a thin film using the reactor 200 according to one embodiment, the reactant X is supplied through the first inlet 210 while an inert gas is supplied through the second inlet 212. The reactant X is guided by the first inflow channel 211 into the reaction space 251 while being prevented from entering the second inflow channel 213 by the inert gas. In such an embodiment, portions of the reactant X flow along the longest paths along the sidewalls of the first groove 241a, and arrive relatively slowly at the first plate periphery 240c of the upper gas flow control plate 240. Other portions of the reactant X flow along the shortest path via the center of the first groove 241a, and arrive relatively quickly at the first plate periphery 240c of the upper gas flow control plate 240. Accordingly, an amount of gas flowing per unit of time from the sides of the first groove 241a is relatively small, and an amount of gas flowing per unit of time from the center of the first groove 241a is relatively large. Thus, more reactant gas is supplied to the center portion of the circular substrate 250 where more reactant gas is needed than the side portions of the substrate. This configuration allows the reactant X to be adsorbed effectively onto the substrate 250 positioned in the reaction space 251. The step is preferably conducted for a sufficient period of time to saturate the substrate surface with the reactant X. Desirably, the adsorption is self-limiting reaction to form no more than a molecular monolayer.

Next, excess reactant X and any reaction by-products are purged (or otherwise removed). The preferred removal step is conducted by supplying a purging or inert gas through both of the first and second inlets 210 and 212.

Subsequently, the reactant Y is supplied through the second inlet 212 while an inert gas is supplied through the first inlet 210. The reactant Y is supplied through the second inflow channel 213 into the reaction space 251 while being prevented from entering the first inflow channel 211 by the inert gas flowing out from the first inflow channel 211. Portions of the reactant Y flow along the longest paths along the sidewalls of the lower groove 243, and arrive relatively slowly at the plate periphery of the lower gas flow control plate 242. Other portions of the reactant Y flow along the shortest path via the center of the lower groove 243, and arrive relatively quickly at the plate periphery of the lower gas flow control plate 242. Accordingly, an amount of gas flowing from the sides of the lower groove 243 is relatively small, and an amount of gas flowing from the center of the lower groove 243 is relatively large such that more reactant gas can be supplied per unit of time to the center portion of the circular substrate 250 where more reactant gas is needed. This allows the reactant Y to effectively react with adsorbed species or fragments of the reactant X on the substrate 250. The reactant Y is supplied for a sufficient period of time so that the adsorbed monolayer is completely reacted.

Next, excess reactant Y and any reaction by-products are purged out. This purging step is conducted by supplying a purging or inert gas through both of the first and second inlets 210 and 212. Then, if additional deposition is required, the above sequence of steps is repeated in a plurality of cycles. Preferably, the steps are sequentially repeated at least 5 times until the desired thickness is reached. During the steps described above, the valves located upstream of the inlets 210 and 212 are used to control supplies of the reactants and inert gas.

In another embodiment, an ALD method may start with a non-adsorbing reactant. In certain embodiments, additional reactants may be used for film formation. For example, the substrate surface may be treated with an initial surface treatment agent, e.g., water or other hydroxyl-forming agent, prior to supplying the reactant X into the reaction space. A reducing species may also be used in each cycle to strip ligands, which help make the process self-limiting, from adsorbed species. In addition, additional reactants that contribute to the film may be used in each cycle or every few cycles. For ALD recipes with greater than two reactants, the illustrated channels can be used or additional plates can be employed for additional reactants.

In order to conduct the process explained above, the ALD reactor 200 preferably includes a control system. The control system controls the supplies of the reactants and inert gas to provide desired alternating and/or sequential pulses of reactants. The control system can include a processor, a memory, and a software program configured to conduct the process. It may also include other components known in the industry. Alternatively, a general purpose computer can be used for the control system. The control system automatically opens or closes valves on the reactant and inert gas lines according to the program stored in the memory.

The first groove 241a and the lower groove 243 having non-uniform flow paths may be used for ALD on a circular substrate. Such a circular substrate may have relatively high topography or surface area. For example, a circular substrate may have a high aspect ratio DRAM capacitor structure having deep trenches. An amount of gas flowing over the center of the circular substrate is advantageously relatively larger for uniform and efficient deposition on the substrate.

Referring to FIGS. 6 and 7A-7C, an ALD apparatus according to another embodiment will be described below. The configuration of the atomic layer deposition apparatus can be as described above in connection with FIG. 2 except for the configuration of the gas flow control guide structure. Accordingly, like reference numerals are used for like parts in FIGS. 2 and 6.

The illustrated atomic layer deposition (ALD) apparatus 600 includes a reactor cover 201, a reactor base 202, a reactor base driver 280, a gas flow control guide structure 205, and an outer wall 298. The reactor cover 201 and the reactor base 202 may be in sealing contact with each other and define a reaction chamber during a deposition process. The reaction chamber includes a reaction space 251 in which a substrate 250 is processed. The reactor base 202 is detachable from the reactor cover 201 for loading or unloading a substrate 250. The reactor cover 201 includes first and second inlets 210 and 212, and an exhaust outlet 220. The reactor cover 201 also includes a cover heater 230 on outer surfaces of the reactor cover 201. The reactor base 202 includes a substrate holder 260, one or more substrate supporting pins 262, and a pedestal 270.

The pedestal 270 supporting the reactor base 202 may include a horizontal portion including a substrate heater disposed under the substrate holder 260 and a central vertical portion supporting the center of the substrate holder 260. The horizontal portion and the central vertical portion may form a single body.

The reactor base driver 280 for driving the reactor base 202 is configured to move the reactor base 202 in a vertical direction, using a driving device (not shown) such as a motor. Before or after a deposition process, the reactor base 202 is moved down, and is detached from the reactor cover 201 so that the reaction chamber is open. The substrate 250 can be loaded or unloaded by robotics through a gate valve (not shown) in the outer wall 298.

The reactor base driver 280 includes vertical movement members 271 and 272 fixed at the lower portion of the outer wall 298, a first plate 274 connected to the vertical movement members 271 and 272 and being vertically movable, a main cylinder 273 for driving the first plate 274 up and down, a second plate 275 connected to the central vertical portion of the pedestal 270 and being vertically movable, and levelers 279 connected to the first and second plates 274 and 275 and horizontally driving the reactor base 202. The ALD apparatus may include one or more levelers 279 to adjust the reactor base 202. This configuration allows the reactor base 202 to be in substantially perfect sealing contact with the reactor cover 201. Each of the levelers 279 may include level control members 276 and 277 and an initial level control member 278. The level control members 276 and 277 may include at least one of an air cylinder and a spring. The initial level control member 278 may be a level nut.

The substrate supporting pins 262 are vertically moved by a substrate supporting pin driver 290. The substrate supporting pin driver 290 includes a horizontal plate 292, a central pivot 293, a peripheral pivot 294, and an air cylinder 295.

Figure 7A:
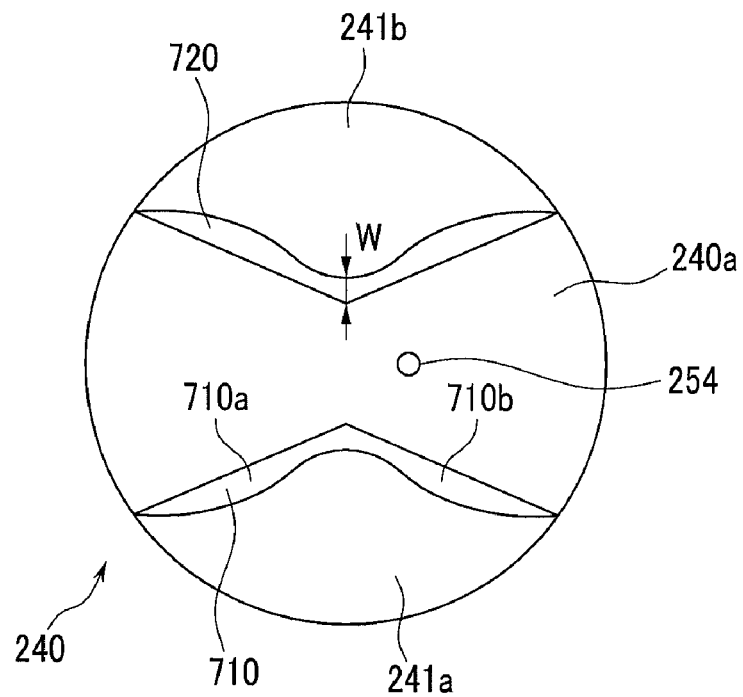
FIGS. 7A and 7B are schematic top plan views of embodiments of upper and lower gas flow control plates of the apparatus of FIG. 6.
Figure 7B:
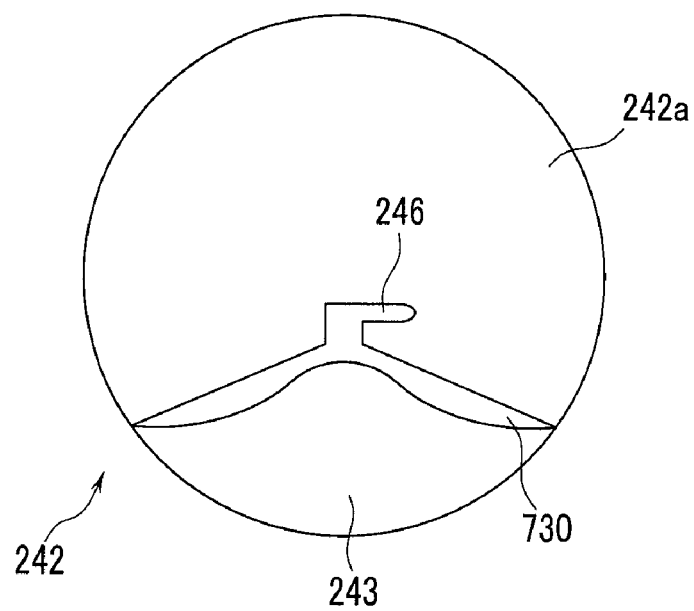
Figure 7C:
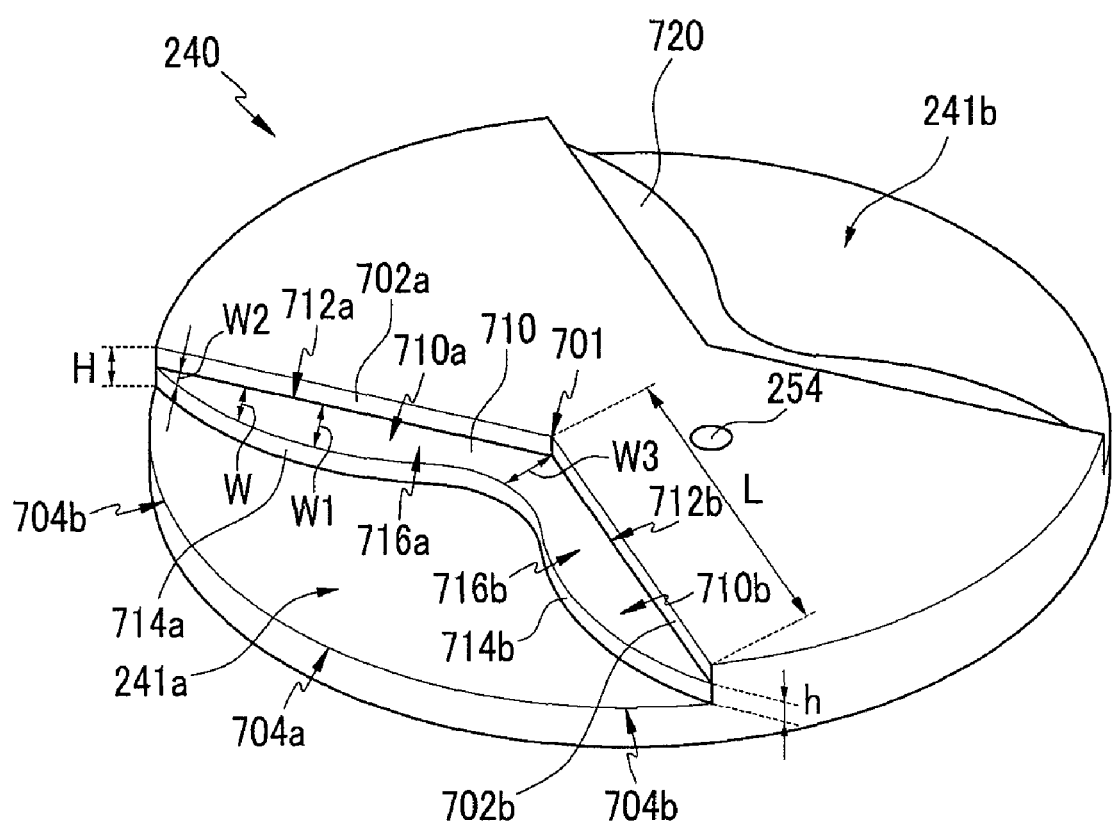
FIG. 7C is a schematic perspective view of the upper gas flow plate of FIG. 6.

The gas flow control guide structure 205 includes an upper gas flow control plate 240 and a lower gas flow control plate 242. Referring to FIGS. 7A-7C, the upper gas flow control plate 240 has first and second fan-shaped grooves 241a and 241b tapered toward its central portion. The first groove 241a defines a first inflow channel or passage 211 in cooperation with a portion of an inner bottom surface of the reactor cover 201 for the reactant X supplied through the first inlet 210. The second groove 241b defines an outflow channel or passage 221 in cooperation with another portion of the inner bottom surface of the reactor cover 201 for evacuation of excess reactant and reaction by-products. The upper gas flow control plate 240 also has a through-hole 254 vertically penetrating the upper gas flow control plate 240. The through-hole 254 is configured to be in fluid communication with the second inlet 212 and a groove 246 of the lower gas flow control plate 242. Multiple through-holes can be provided for embodiments with three or more plates for three or more reactants. The upper gas flow control plate 240 also includes a solid part 240a between or around the first and second grooves 241a and 241b. The solid part 240a forms sidewalls of the first and second grooves 241a and 241b.

The lower gas flow control plate 242 has a lower fan-shaped groove 243 tapered toward its central portion. The lower groove 243 defines a second inflow channel 213 with a lower surface of the upper gas flow control plate 240 for the reactant Y supplied through the second inlet 212. The lower groove 243 further extends to a central groove 246 of the lower gas flow control plate 242 so that the second inflow channel 213 is in fluid communication with the second inlet 212 via the through-hole 254 of the upper gas flow control plate 240. The lower gas flow control plate 242 also includes a solid part 242a around the lower groove 243 and the central groove 246. The solid part 242a forms sidewalls of the grooves 243 and 246. In addition, a lower surface of the lower gas flow control plate 242 and an upper surface of the substrate holder 260 define the reaction space 251 in which the substrate 250 is processed.

In one embodiment, the upper gas flow control plate 240 may have one or more steps in the first groove 241a such that more reactant gases per unit of time can be supplied over the center portion of a substrate than over the side portions of the substrate. The steps can be integrally formed with the upper gas flow control plate 240. In other embodiments, the upper gas flow control plate 240 may have one or more inserts to define such steps in the first groove 241a.

In the illustrated embodiment, the upper gas flow control plate 240 may include first and second gas flow resistance control members 710 and 720 in the first and second grooves 241a and 241b, respectively. The lower gas flow control plate 242 may also include a lower gas flow resistance control member 730 in the lower groove 243. In the illustrated embodiment, the gas flow resistance control members 710, 730 are shaped steps between the solid parts and the inlet grooves of each plate, creating narrowed portions of the channels. The width of these members varies in the direction of the groove sidewalls, thus tailoring resistance and relative gas flows along the various paths. In addition, the upper gas flow control plate 240 and the lower gas flow control plate 242 have a substantially circular shape. The resistance control members 710-730 may be integrated with or detachable from the gas flow control plates 240, 242. In certain embodiments, the upper gas flow control plate 240 may include only the first gas flow resistance control member 710 in the first groove 241a, but not the second gas flow resistance control member 720 in the second groove 241b.

Figure 6:
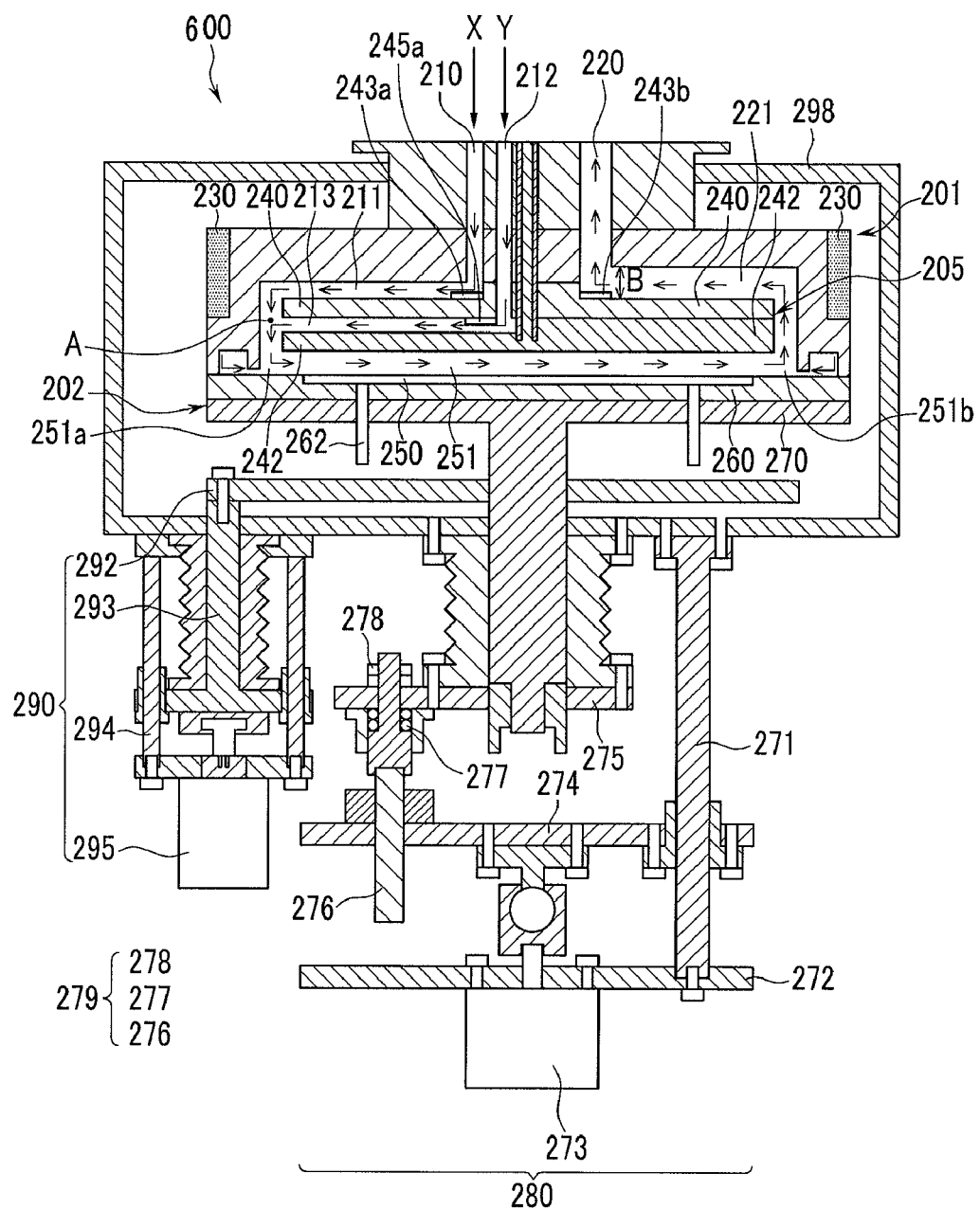
FIG. 6 is a schematic cross-sectional view of an atomic layer deposition apparatus according to another embodiment.

Referring to FIG. 7C, the first groove 241a of the upper gas flow control plate 240 includes a corner 701 and first and second sidewalls 702a, 702b. The upper gas flow control plate 240 includes a first plate periphery 704a, 704b, forming a circumference of the fan-shaped first groove 241a. The corner 701 forms a region from which a gas flow starts in the first groove 241a. The sidewalls 702a, 702b define the first groove 241a. The first plate periphery 704a, 704b forms an open region from which a gas flow exits toward the reaction space 251 (FIG. 6).

In the illustrated embodiment, the first gas flow resistance control member 710 includes first and second portions 710a, 710b. In the embodiment where the first gas flow resistance control member 710 is provided as an insert or attachment to the upper gas flow control plate 240, each of the first and second portions 710a, 710b includes a first side surface 712a, 712b, a second side surface 714a, 714b, a top surface 716a, 716b, and a bottom surface (not shown). In other embodiments, where the first gas flow resistance control member 710 is integral with the upper gas flow control plate 240, each of the first and second portions 710a, 710b may not include surfaces corresponding to the second side surface 714a, 714b and the bottom surface of the illustrated first gas flow resistance control member 710.

The first side surfaces 712a, 712b of the first and second portions 710a, 710b are substantially planar. The first and second portions 710a, 710b are connected to each other near the corner 701 of the first groove 241a at an angle such that the first side surfaces 712a, 712b of the first and second portions 710a, 710b contact the sidewalls 702a, 702b of the first groove 241a.

The second side surfaces 714a, 714b of the first and second portions 710a, 710b are curved when viewed from above the upper gas flow control plate 240, as shown in FIG. 7A. In the illustrated embodiment, each of the first and second portions 710a, 710b has a width W between the sidewalls 702a, 702b and the second side surface 714a, 714b. The width W varies with the sidewall 702a, 702b of the first groove 241a such that a first width W1 at the middle portion of each of the first and second portions 710a, 710 is greatest. A second width W2 near the first plate periphery 704b is smallest. A third width W3 near the corner 701 of the first groove 701 is substantially smaller than the first width W1, but may be greater than the second width W2.

In one embodiment, the first width W1 may be about 0.1 to about 1.0 times the length L of one of the first and second sidewalls 702a, 702b. The second width W2 may be about 0.1 to about 0.9 times the length L of one of the first and second sidewalls 702a, 702b. The third width W3 may be about 0.05 to about 0.9 times the length L of one of the first and second sidewalls 702a, 702b. In one embodiment, the first gas flow resistance control members 710 may have a height h of about 0.2 to about 0.8 times a groove height H. The groove height H is the height of the sidewalls 702a, 702b from the bottom surface of the first groove 241a, as shown in FIG. 7C. Thus, the first inflow channel 211 (FIG. 6) has a first height at the center of the first groove 241a (that is, a distance between the bottom of the first groove 241a and the inner surface of the reactor cover 201 (chamber ceiling)) and a second height near the sidewalls 702a, 702b of the first groove 241a (that is, a distance between the top surface 716a, 716b of the first gas flow resistance control member 710 and the inner surface of the reactor cover 201 (chamber ceiling)), where the first height is greater than the second height.

The second side surfaces 714a, 714b of the first and second portions 710a, 710b form a wave shape when viewed from above. The wave shape includes a prominent portion, a depressed portion, and a prominent portion from one end to the other end along the two sidewalls 702a, 702b of the first groove 241a.

The configuration of the second gas flow resistance control members 720 can be the mirror image of that described above with respect to the first gas flow resistance control member 710. The configuration of the lower gas flow resistance control member 730 can be the same as described above with respect to the first gas flow resistance control member 710 except that the lower gas flow resistance control member 730 further includes a portion that extends to the groove 246 of the lower gas flow control plate for communication with the second inlet 212 (FIG. 6) by way of the through-hole 254 (FIG. 7A).

Each of the first and second grooves 241a and 241b and the lower groove 243 have a bottom surface that is lower than a respective one of the top surfaces of the solid parts 240a and 242a. The first and second gas flow resistance control member 243a and 243b and the lower gas flow resistance control member 245a may reduce space along gas flow paths in the grooves 241a, 241b, 243, so as to increase gas flow resistance.

In the grooves 241a, 241b, and 243 having a fan shape, the flow resistance control members 243a, 243b, and 245a have prominent portions near the middles of the sidewalls 702a, 702b of the grooves 241a, 241b, and 243 and depressed portions near the corner 701 thereof, as shown in FIGS. 7A-7C. Thus, gas flow resistance near the sidewalls 702a, 702b of the grooves 241a, 241b, and 243 is greater than that near the center thereof Accordingly, an amount of gas flowing near the sidewalls 702a, 702b of the grooves 241a, 241b, and 243 is relatively small and an amount of gas flowing over the center of the grooves 241a, 241b, and 243 is relatively large, even compared to the embodiments of FIGS. 2-5. Thus, a greater amount of reactant gases may be supplied over the center portion of the circular substrate 250 where more reactant gas is needed than the side portions of the substrate 250.

As described above and with reference to FIG. 6, a gas from the first inlet 210 flows through the first groove 241a toward the external circumference direction of the upper gas flow control plate 240, through the reaction space 251, around another external circumference direction of the upper gas flow control plate 240, and inward to the exhaust outlet 220. The gas arriving at an upstream periphery 251a from the first inflow channel 211 flows while being spread into a fanned and flattened flow shape. Accordingly, the gas arriving at an upstream periphery 251a has different inflowing distributions, depending on the gas flow resistance in the fanwise first groove 241a. A skilled artisan will appreciate that the first gas flow resistance control member 710 and the lower gas flow resistance control member 730 can have various other structures to provide a non-uniform laminar flow, depending on the needs.

In certain embodiments, a gas flow through an inflow channel (for example, the first inflow channel 211 and the second inflow channel 213 of FIG. 2) can be modified by one or more grooves and/or steps on an upper surface of the inflow channel, such that more reactant gases per unit of time can be supplied over the center portion of a substrate than over the side portions of the substrate. For example, the first inflow channel 211 (FIG. 2) can provide a modified gas flow by one or more shaped grooves on the inner surface of the reactor cover 201 (chamber ceiling) that faces the first groove 241a of the upper gas flow control plate 240. Such grooves on the inner surface of the reactor cover 201 may be used in cooperation with one of the gas flow control plates of the embodiments described above in connection with FIGS. 3A and 7A, or alternatively with a gas flow control plate having a planar top surface without a groove. The second inflow channel 213 (FIG. 2) can also provide a modified gas flow by one or more shaped grooves on the lower surface of the upper gas flow control plate 240 that faces the groove 243 of the lower gas flow control plate 242. Such grooves on the lower surface of the upper gas flow control plate 240 may be used in cooperation with one of the gas flow control plates of the embodiments described above in connection with FIGS. 3B and 7B, or alternatively with an underlying gas flow control plate having a planar top surface without a groove.

Figure 8A:
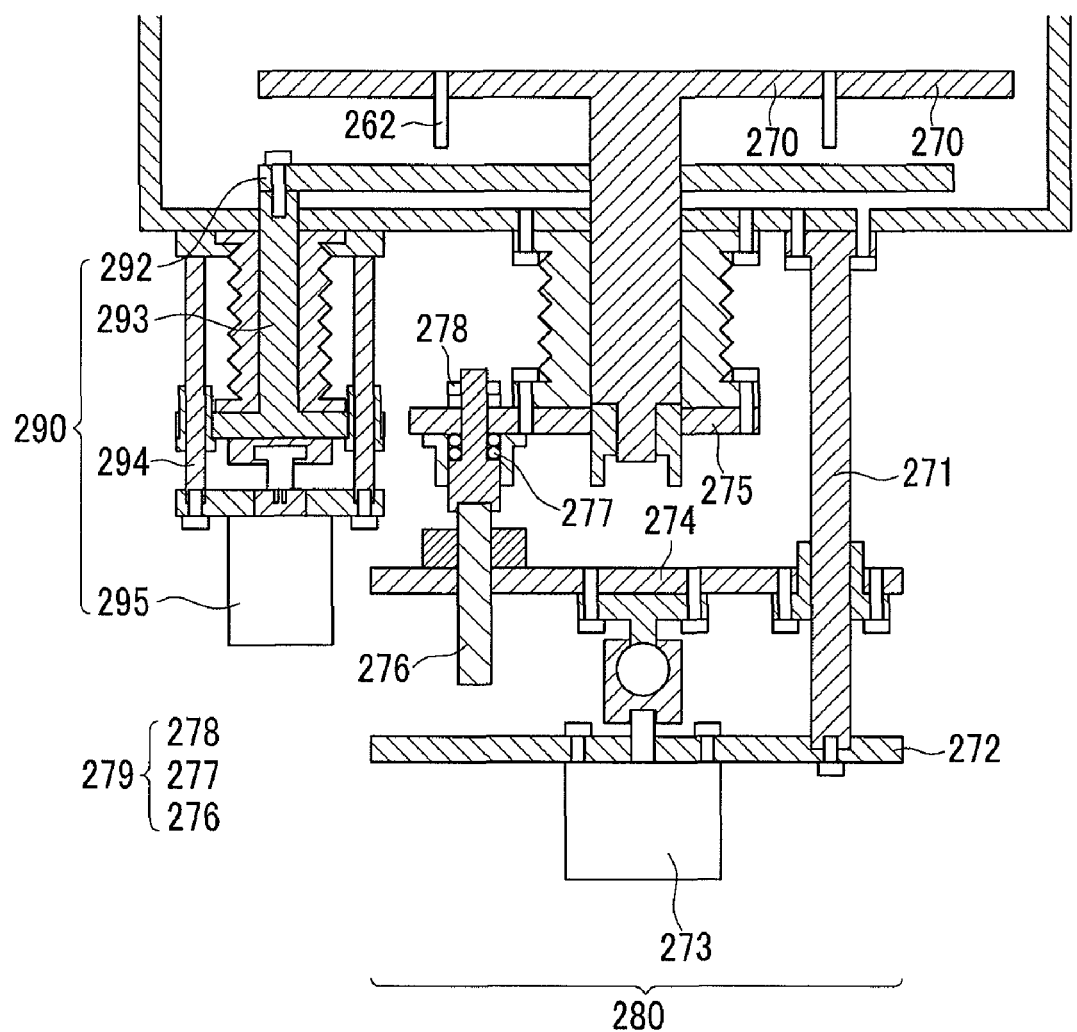
FIG. 8A is a schematic cross-sectional view of one embodiment of a driver for adjusting a reactor base of an atomic layer deposition apparatus.

Referring to FIGS. 2 and 8A-8E, one embodiment of a reactor base driver 280 and a driving method thereof for sealing the reaction space of an atomic layer deposition reactor during the deposition process will be described in detail. In FIG. 8A, the pedestal 270 and the reactor base driver 280 of the reactor base 202 in the atomic layer deposition apparatus of FIG. 2 are shown.

The illustrated pedestal 270 includes a horizontal portion disposed under the substrate holder 260 (FIG. 2) and a central vertical portion supporting the center of the substrate holder 260. The reactor base driver 280 includes vertical movement members 271 and 272, a first plate 274, a main cylinder 273, a second plate 275, and a leveler 279. The leveler 279 includes level control members 276 and 277 and an initial level control member 278. The level control members 276 and 277 include at least one of an air cylinder and a spring, and the initial level control member 278 may be a level nut. The details of the foregoing components can be as described above in connection with FIG. 2.

Figure 8B:
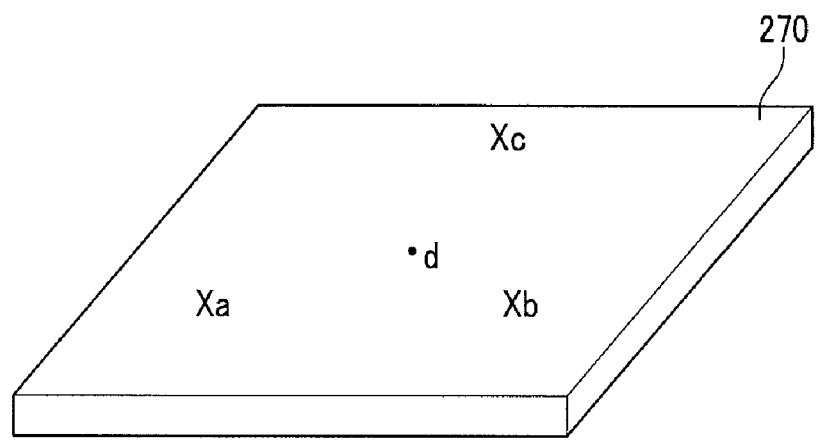
FIGS. 8B to 8E are schematic views illustrating one embodiment of a method of adjusting a reactor base of an atomic layer deposition apparatus.

FIG. 8B shows the horizontal portion of the pedestal 270 of the atomic layer deposition apparatus. The central vertical portion of the pedestal 270 is located at a position "d." A plurality of levelers 279 of the reactor base driver 280 are located under positions Xa, Xb, and Xc. In the illustrated embodiment, the plurality of levelers 279 include three levelers to support the three positions Xa, Xb, and Xc. The three positions Xa, Xb, and Xc are spaced from one another and are not in alignment with one another, forming the corners of a triangle. In other embodiments, the levelers may include four or more levelers to adjust four or more portions of the horizontal portion of the pedestal 270.

A method of driving the reactor base driver 280 for defining and sealing the reaction space 251 (FIG. 2) will be described in detail. Before or after a deposition process, the first and second plates 274 and 275 are moved down by the main cylinder 273 fixed at the vertical movement members 271 and 272 such that the reactor base connected to the second plate 275 is moved down. Accordingly, the reactor base 202 is detached from the reactor cover 201 so that the reaction chamber or reaction space 251 is open. While the reaction space 251 is open, the substrate supporting pins 262 may be lifted up or moved down such that the substrate 250 is loaded on or unloaded from the substrate holder 260.

In order to perform a deposition process, the substrate supporting pins 262 are moved down such that the substrate 250 is loaded onto the substrate holder 260. Then, the first and second plates 274 and 275 are moved up by the main cylinder 273 so that the reactor base 202 connected to the second plate 275 is moved up. Accordingly, the lower peripheral portions of the reactor cover 201 are attached to the upper portions of the substrate holder 260 in the reactor base 202 to define the reaction space 251. The substrate supporting pins 262 are vertically moved by the substrate supporting pin driver 290. The substrate supporting pin driver 290 includes a horizontal plate 292, a central pivot 293, a peripheral pivot 294, and an air cylinder 295.

In addition, the reactor base 202 must be in substantially perfect sealing contact with the reactor cover 201 to define the reaction space 251. The atomic layer deposition apparatus described above includes the plurality of levelers 279 located at at least three different positions and not in alignment with one another. By independently adjusting the plurality of levelers 279, the reactor base 202 may come into substantially perfect sealing contact with the reactor cover 201.

The plurality of levelers 279 are connected to the first and second plates 274 and 275. The initial level control member 278 of each of the levelers 279 may include a level nut, and is used for maintaining initial parallel between the first plate 274 and the second plate 275. A distance between the first plate 274 and the second plate 275 is regularly controlled at at least three different horizontal positions by the initial level control members 278, such as level nuts disposed at different positions. In addition, the level control members 276 and 277 of the leveler 279 include an air cylinder or a spring having compressibility so that the level of the second plate 275 is delicately maintained to allow the reactor base 202 to be in complete contact with the reactor cover 201.

Figure 8C:
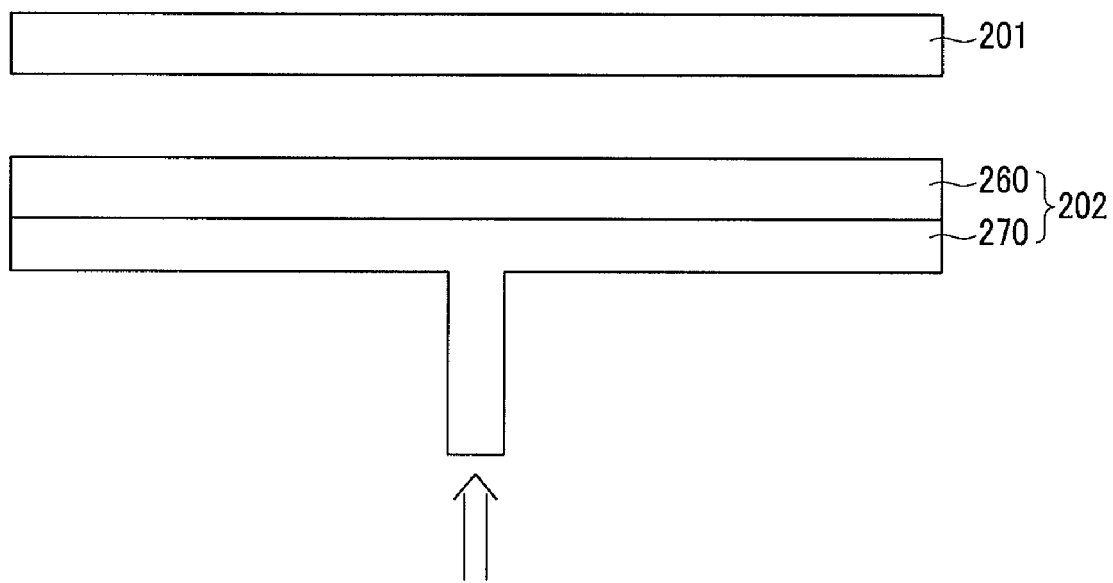

Referring to FIGS. 8A and 8C, the main cylinder 273 connected to the vertical movement members 271 and 272 is driven such that the first and second plates 274 and 275 are moved upward for moving the pedestal 270 upward so as to move the reactor base 202 upward. The reactor base 202 is moved upward while the relative position between the first plate 274 and the second plate 275 is maintained by using the initial level control members 278, such as the level nuts as shown in FIG. 8A.

Figure 8D:
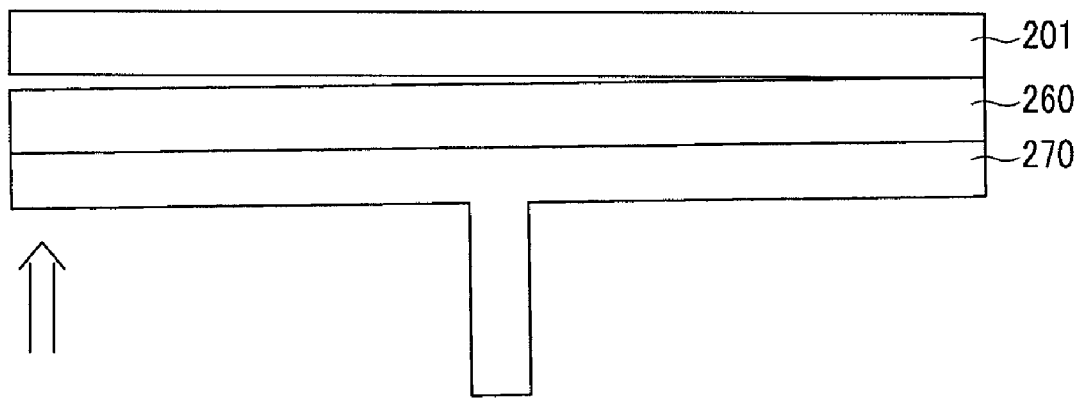
Figure 8E:
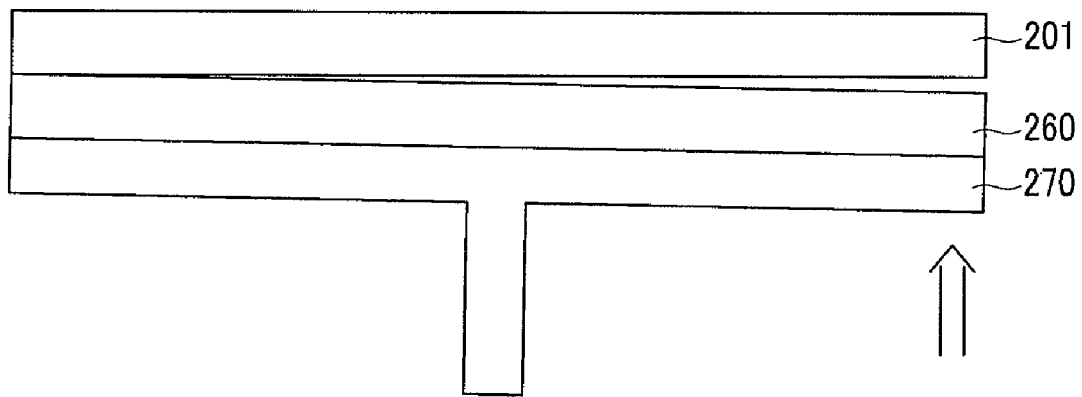

In FIGS. 8C to 8E, the arrows indicate a direction of force exerted on the reactor base 202. If the first and second plates 274 and 275 are moved upward while the relative position between the first plate 274 and the second plate 275 is substantially completely maintained by using the level nuts 278, the substrate holder 260 and the pedestal 270 are also moved upward while keeping the base 202 level. Thus, the substrate holder 260 comes into substantially perfect sealing contact with the lower peripheral portions of the reactor cover 201, defining the reaction space 251.

However, if the first and second plates 274 and 275 are moved upward in the state while the parallelism between the first plate 274 and the second plate 275 is not maintained at the left side, the substrate holder 260 does not contact the reactor cover 201 at the left side as shown in FIG. 8D. As shown in FIG. 8D, the level control members 276 and 277 of the leveler 279 disposed at the left side may be moved upward using the air cylinder or spring until the substrate holder 260 completely contacts the reactor cover 201 at the left side. As described above, the level control members 276 and 277 include at least one of an air cylinder and a spring such that the vertical movement of the control member 276 and 277 may be controlled easily and delicately. Accordingly, the substrate holder 260 may substantially completely contact the reactor cover 201 at the left side to seal the reaction space 251.

As shown in FIG. 8E, if the first and second plates 274 and 275 are moved upward while the parallel relationship between the first plate 274 and the second plate 275 is not maintained at the right side, the substrate holder 260 does not contact the reactor cover 201 at the right side. The level control members 276 and 277 of the leveler 279 disposed at the right side may be moved upward using the air cylinder or spring until the substrate holder 260 substantially completely contacts the reactor cover 201 at the right side. Accordingly, the substrate holder 260 may substantially completely contact the reactor cover 201 at the left side to seal the reaction space 251.

It is known that a parallel relationship between two planes is complete when equal distance is established at at least three different corresponding positions of the planes that are not in alignment with one another. The atomic layer deposition apparatus according to the embodiments described above includes the plurality of levelers 279 located at at least three different positions not in alignment with one another. This configuration allows the reactor base 202 to be in substantially complete contact with the reactor cover 201 by independently adjusting the plurality of levelers 279.

In addition, the level control members 276 and 277 of the leveler 279 include an air cylinder or a spring having compressibility so that the vertical movement of the level control members 276 and 277 are easily controlled. Thus, the level of the second plate 275 can be easily and delicately maintained to allow the reactor base 202 to be in substantially complete contact with the reactor cover 201.

According to the embodiments described above, the supply time and amount of a reactant gas required for ALD may be reduced for deposition of a thin film on a non-planar circular substrate, thereby increasing productivity of the ALD apparatus. In addition, the reactor space can be accurately and easily sealed in all directions.

Although various preferred embodiments and the best mode have been described in detail above, those skilled in the art will readily appreciate that many modifications of the exemplary embodiment are possible without materially departing from the novel teachings and advantages of this invention.

We claim:

1. An atomic layer deposition (ALD) reactor, comprising:
a reaction chamber comprising a reaction space, a reactor cover and a reactor base in sealing contact with the reactor cover to define the reaction space, the reactor base being detachable from the reactor cover;
a reactor base driver configured to vertically move the reactor cover between first and second positions, wherein the reactor space is open at the first position, and is closed at the second position, wherein the reactor base driver is configured to independently adjust at least three portions of the reactor base to provide a substantially perfect seal to the reactor space at the second position, the at least three portions being horizontally spaced apart from one another and are not aligned with one another;
one or more inlets;
an exhaust outlet;
a gas flow control guide structure residing over the reaction space, the gas flow control guide structure being interposed between the one or more inlets and the reaction space, the gas flow control guide structure comprising one or more gas channels, each of the channels extending from a respective one of the one or more inlets to a first portion of a periphery of the reaction space, at least one of the channels including two sidewalls that define the channel so as to widen as the channel extends from the inlet to the reaction space, wherein the at least one channel defines a plurality of flow paths from near a generally central portion of the gas flow control guide structure to the first portion of the periphery of the reaction space, and wherein the plurality of flow paths include a first side flow path near one of the sidewalls, a second side flow path near the other of the sidewalls, and a central flow path at a midpoint between the sidewalls, the central flow path having a pathlength shorter than that of the side flow paths; and a substrate holder positioned to expose a supported substrate to the reaction space, wherein the gas flow control guide structure is configured to generate a gas flow direction of reactant in the reaction space that is predominantly parallel to a major surface of the supported substrate from the first portion of the periphery of the reaction space to a second portion of the periphery of the reaction space, wherein the second portion is on the opposite side from the first portion.

2. The reactor of claim 1, wherein the gas flow control guide structure comprises one or more gas flow control plates stacked over one another, wherein at least one of the gas flow control plates comprises a groove including two sidewalls that form the two sidewalls of the at least one channel, the two sidewalls of the groove defining the at least one channel in cooperation with an immediately overlying one of the gas flow control plates or an inner ceiling surface of the reaction chamber, wherein the groove extends from near a generally central portion of the gas flow control plate to a portion of an edge of the gas flow control plate while widening as the groove extends from the generally central portion of the gas flow control plate to the portion of the edge of the gas flow control plate, and wherein the groove defines the plurality of flow paths from near the generally central portion of the gas flow control plate to the portion of the edge of the gas flow control plate.

3. The reactor of claim 2, wherein the central flow path provides a greater amount of gas per unit of time than each of the side flow paths.

4. The reactor of claim 3, wherein the plurality of flow paths further include other flow paths between the central flow path and one of the side flow paths, and wherein the other flow paths are longer as they are closer to the one of the side flow paths.

5. The reactor of claim 2, wherein the at least one of the gas flow control plates has a non-circular shape.

6. The reactor of claim 5, wherein the non-circular shape comprises a truncated oval shape.

7. The reactor of claim 6, wherein the at least one of the gas flow control plates includes straight edges and round edges, wherein the lengths of the round edges are generally longer than the lengths of the straight edges.

8. The reactor of claim 2, wherein the at least one of the gas flow control plates has a first length generally perpendicular to the gas flow direction in the reaction space, and a second length generally parallel to the gas flow direction in the reaction space, and wherein a ratio of the first length to the second length is from about 1:1 to about 1.2:1.

9. The reactor of claim 2, wherein the sidewalls of the groove form an angle relative to each other, the angle being from about 20° to about 180°.

10. The reactor of claim 2, wherein the groove has a first depth at the center of the groove and a second depth at an edge of the groove, and wherein the first depth is greater than the second depth.

11. An atomic layer deposition (ALD) reactor, comprising:
a reaction chamber comprising a reaction space;
one or more inlets;
an exhaust outlet;
a gas flow control guide structure residing over the reaction space, the gas flow control guide structure being interposed between the one or more inlets and the reaction space, the gas flow control guide structure comprising one or more gas channels, each of the channels extending from a respective one of the one or more inlets to a first portion of a periphery of the reaction space, at least one of the channels including two sidewalls that define the channel so as to widen as the channel extends from the inlet to the reaction space, wherein the at least one channel has a first height at the center of the channel and a second height at one of the sidewalls, the first height being greater than the second height, wherein
the gas flow control guide structure comprises one or more gas flow control plates stacked over one another,
at least one of the gas flow control plates comprises a groove including two sidewalls that form the two sidewalls of the at least one channel, the two sidewalls of the groove defining the at least one channel in cooperation with an immediately overlying one of the gas flow control plates or an inner ceiling surface of the reaction chamber,
the groove extends from near a generally central portion of the at least one gas flow control plate to a portion of an edge of the at least one gas flow control plate while widening as the groove extends from the generally central portion to the portion of the edge,
the groove defines a plurality of flow paths from near the generally central portion of the at least one gas flow control plate to the portion of the edge of the gas flow control plate,
the groove has a first depth at the center of the groove and a second depth at an edge of the groove, and wherein the first depth is greater than the second depth, and
the gas flow control guide structure further includes one or more gas flow resistance control members in the groove, wherein one or more gas flow resistance control members are detachable from the at least one of the gas flow control plates; and
a substrate holder positioned to expose a supported substrate to the reaction space, wherein the gas flow control guide structure is configured to generate a gas flow direction of reactant in the reaction space that is predominantly parallel to a major surface of the supported substrate from the first portion of the periphery of the reaction space to a second portion of the periphery of the reaction space, wherein the second portion is on the opposite side from the first portion.

12. The reactor of claim 11, wherein the gas flow control guide structure further includes one or more steps in the groove of the at least one of the gas flow control plates, one or more steps defining the first and second depths.

13. The reactor of claim 12, wherein the one or more steps are integrally formed with the at least one of the gas flow control plates.

14. The reactor of claim 11, wherein the groove includes a corner near the generally central portion of the gas flow control plate, wherein the two sidewalls of the groove define the groove and meet at the corner, and wherein the gas flow resistance control members include one or more portions that extend along the sidewalls of the groove.

15. The reactor of claim 14, wherein the one or more portions include a first surface that contacts the sidewalls of the groove, and wherein the one or more portions further include a second surface facing away from the first surface.

16. The reactor of claim 15, wherein the one or more portions have a width extending between the first and second surfaces, the width varying along the sidewalls of the groove.

17. The reactor of claim 16, wherein the width is greatest at a middle point between the corner and the portion of the edge of the gas flow control plate.

18. The reactor of claim 17, wherein the width is smallest at a point near the portion of the edge of the gas flow control plate.

19. The reactor of claim 16, wherein the gas flow resistance control member has a first width at the corner, and wherein the first width is about 0.05 to about 0.9 times a length between the corner and the portion of the edge of the gas flow control plate.

20. The reactor of claim 11, wherein the one or more gas flow resistance control member has a thickness of about 0.2 to about 0.8 times that of the maximum height of the gas flow control plate.

21. The reactor of claim 11, wherein the at least one gas flow control plate has a substantially circular shape.

22. A deposition apparatus, comprising:
a reactor cover;
a reactor base in sealing contact with the reactor cover to define a reaction space, the reactor base being detachable from the reactor cover; and
a reactor base driver configured to vertically move the reactor base between first and second positions, wherein the reactor space is open at the first position, and is closed at the second position,
wherein the reactor base driver is configured to independently adjust at least three portions of the reactor base to provide a substantially perfect seal to the reactor space at the second position, and
wherein the at least three portions are horizontally spaced apart from one another and are not aligned with one another.

23. The apparatus of claim 22, wherein the reaction space is configured to provide a substantially exclusive laminar flow path therein.

24. A deposition apparatus, comprising:
a reactor cover;
a reactor base in sealing contact with the reactor cover to define a reaction space, the reactor base being detachable from the reactor cover; and
a reactor base driver configured to vertically move the reactor base between first and second positions, wherein the reactor space is open at the first position, and is closed at the second position,
wherein the reactor base driver is configured to independently adjust at least three portions of the reactor base to provide a substantially perfect seal to the reactor space at the second position, and
wherein the at least three portions are horizontally spaced apart from one another and are not aligned with one another, wherein the reactor base driver includes three or more levelers to independently adjust the vertical levels of the at least three portions of either the reactor cover or the reactor base.

25. The apparatus of claim 24, wherein each of the levelers comprises an air cylinder.

26. The apparatus of claim 24, wherein each of the levelers comprises a spring.

27. The apparatus of claim 22, further comprising an outer wall housing the reactor cover and the reactor base, wherein the reactor base driver comprises:
a vertical movement member that is fixed to a lower portion of the outer wall;
a plate connected to the vertical movement member; and
a vertical driver for driving the plate.

28. The apparatus of claim 27, wherein the vertical driver comprises a cylinder.

* * * * *